(12) United States Patent
Bravyi et al.

(10) Patent No.: US 10,599,989 B2
(45) Date of Patent: *Mar. 24, 2020

(54) EFFICIENT REDUCTION OF RESOURCES FOR THE SIMULATION OF FERMIONIC HAMILTONIANS ON QUANTUM HARDWARE

(71) Applicant: INTERNATIONAL BUSINESS MACHINES CORPORATION, Armonk, NY (US)

(72) Inventors: Sergey Bravyi, Pleasantville, NY (US); Jay M. Gambetta, Yorktown Heights, NY (US); Antonio Mezzacapo, Tarrytown, NY (US); Paul Kristan Temme, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/372,462

(22) Filed: Apr. 2, 2019

(65) Prior Publication Data

US 2019/0228333 A1  Jul. 25, 2019

Related U.S. Application Data

(63) Continuation of application No. 15/437,895, filed on Feb. 21, 2017, now Pat. No. 10,311,370.

(Continued)

(51) Int. Cl.
*G06N 10/00* (2019.01)
*G06F 17/16* (2006.01)
*G06F 17/50* (2006.01)

(52) U.S. Cl.
CPC ............ *G06N 10/00* (2019.01); *G06F 17/16* (2013.01); *G06F 17/5072* (2013.01)

(58) Field of Classification Search
CPC ...... G06N 10/00; G06F 17/16; G06F 17/5072
See application file for complete search history.

(56) References Cited

U.S. PATENT DOCUMENTS

| 7,018,852 B2 | 3/2006 | Wu et al. |
| 7,219,018 B2 | 5/2007 | Vitaliano et al. |

(Continued)

FOREIGN PATENT DOCUMENTS

| EP | 2324444 A2 | 5/2011 |
| JP | 2005269105 A | 9/2005 |

(Continued)

OTHER PUBLICATIONS

International Search Report and Written Opinion for International Application No. PCT/IB2017/054758, dated Nov. 29, 2017, 10 pages.

(Continued)

*Primary Examiner* — Naum Levin
(74) *Attorney, Agent, or Firm* — Cantor Colburn LLP; Vazken Alexanian

(57) ABSTRACT

A technique relates to reducing qubits required on a quantum computer. A Fermionic system is characterized in terms of a Hamiltonian. The Fermionic system includes Fermions and Fermionic modes with a total number of 2M Fermionic modes. The Hamiltonian has a parity symmetry encoded by spin up and spin down parity operators. Fermionic modes are sorted such that the first half of 2M modes corresponds to spin up and the second half of 2M modes corresponds to spin down. The Hamiltonian and the parity operators are transformed utilizing a Fermion to qubit mapping that transforms parity operators to a first single qubit Pauli (Continued)

operator on a qubit M and a second single qubit Pauli operator on a qubit 2M. The qubit M having been operated on by the first single qubit Pauli operator and the qubit 2M having been operated on by the second single qubit Pauli operator are removed.

20 Claims, 14 Drawing Sheets

Related U.S. Application Data

(60) Provisional application No. 62/376,194, filed on Aug. 17, 2016.

(56) References Cited

U.S. PATENT DOCUMENTS

| | | | |
|---|---|---|---|
| 7,307,275 | B2 | 12/2007 | Lidar et al. |
| 7,451,292 | B2 | 11/2008 | Routt |
| 8,513,647 | B1 | 8/2013 | Bacon et al. |
| 9,819,347 | B2* | 11/2017 | Hastings ............... G06N 10/00 |
| 2003/0094606 | A1 | 5/2003 | Newns et al. |
| 2008/0142787 | A1 | 6/2008 | Loss |
| 2016/0132785 | A1 | 5/2016 | Amin et al. |
| 2016/0283857 | A1 | 9/2016 | Babbush et al. |
| 2018/0053112 | A1 | 2/2018 | Bravyi et al. |
| 2018/0096085 | A1* | 4/2018 | Rubin ................. G06F 17/5009 |

FOREIGN PATENT DOCUMENTS

| | | |
|---|---|---|
| WO | 2009143166 A2 | 11/2009 |
| WO | 2015069625 A1 | 5/2015 |
| WO | 2015123083 A2 | 8/2015 |
| WO | 2015123085 A2 | 8/2015 |

OTHER PUBLICATIONS

Alon et al., "The Moore bound for irregular graphs," Feb. 22, 2002, pp. 1-5.
Darling et al, "Rank deficiency in sparse random GF[2] matrices," arXiv:1211.5455v1 [math.PR], Nov. 23, 2012, pp. 1-49.
Gallager, "Low-Density Parity-Check Codes," IRE Transactions on Information Theory, 1962, pp. 21-28.
Gottesman, "Stabilizer Codes and Quantum Error Correction," arXiv:quant-ph/9705052v1 May 28, 1997, pp. 1-122.
List of IBM Patents or Patent Applications Treated as Related; (Appendix P), Date Filed: Apr. 2, 2019, 2 pages.
Moll et al., "Optimizing qubit resources for quantum chemistry simulations in second quantization on a quantum computer," arXiv:1510.04048v3 [quant-ph], May 11, 2016, pp. 1-19.
O'Hara et al; "Quadratic fermionic interactions yield effective Hamiltonians for adiabatic quantum computing", arXiv preprint arXiv:0808.1768 (2008), pp. 1-14.
O'Malley et al., Scalable Quantum Simulation of Molecular Energies, arXiv:1512.06860v2 [quant-ph], Feb. 4, 2017, pp. 1-13.
Seeley et al., "The Bravyi-Kitaev transformation for quantum computation of electronic structure," Chem. Phys., arXiv:1208.5986v1 [quant-ph], Aug. 29, 2012, pp. 1-38.
Sergey Bravyi et al., "Efficient Reduction of Resources for the Simulation of Fermionic Hamiltonians on Quantum Hardware ," U.S. Appl. No. 62/376,194, filed Aug. 17, 2016.
Wecker et al., "Towards Practical Quantum Variational Algorithms," arXiv:1507.08969v2 [quant-ph], Sep. 8, 2015, pp. 1-11.
Bravyi, S. & Kitaev, A. "Fermionic quantum computation", Ann. of Phys., 298(1): 210-226,2002.

* cited by examiner

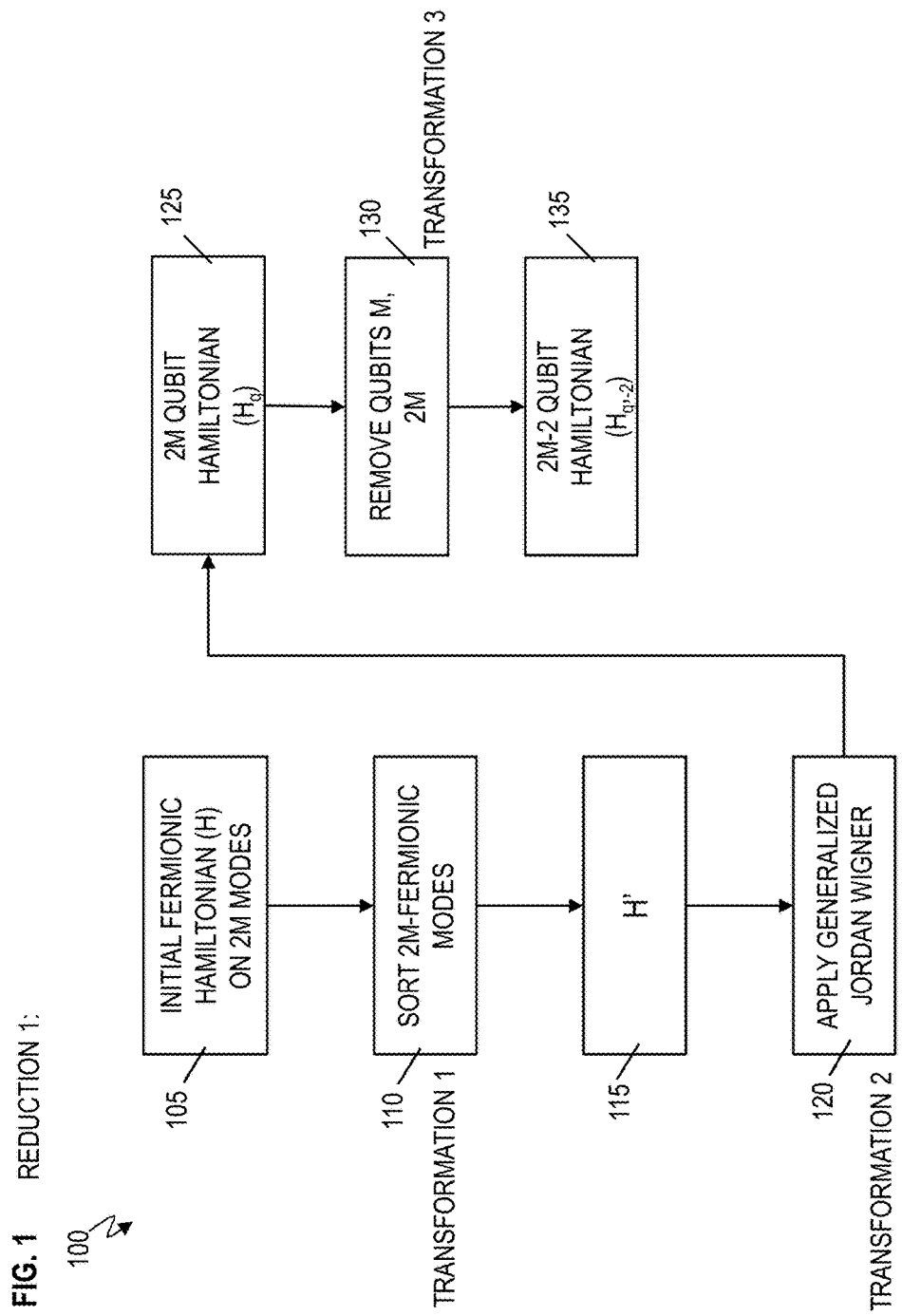

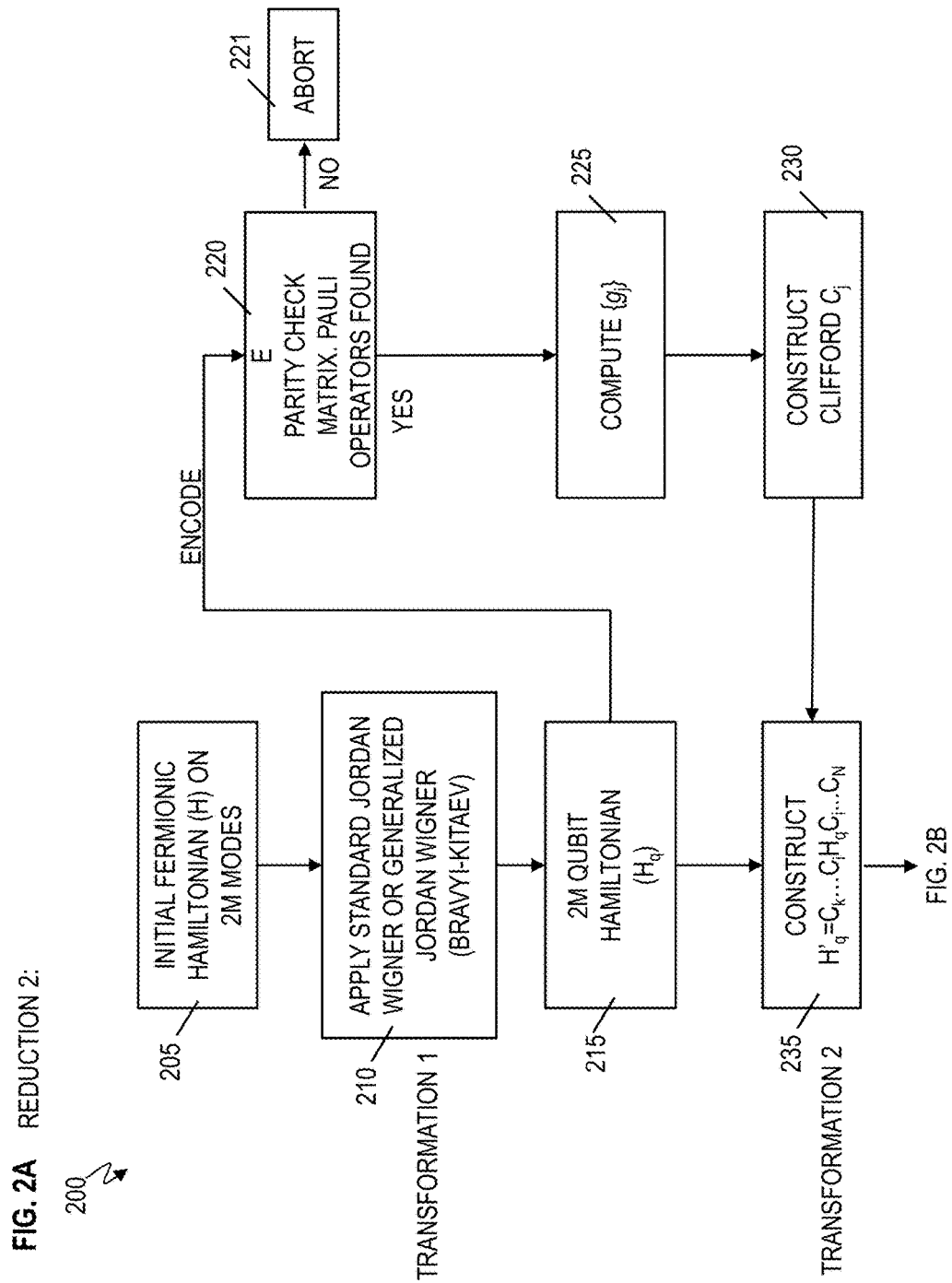
FIG. 2A REDUCTION 2:

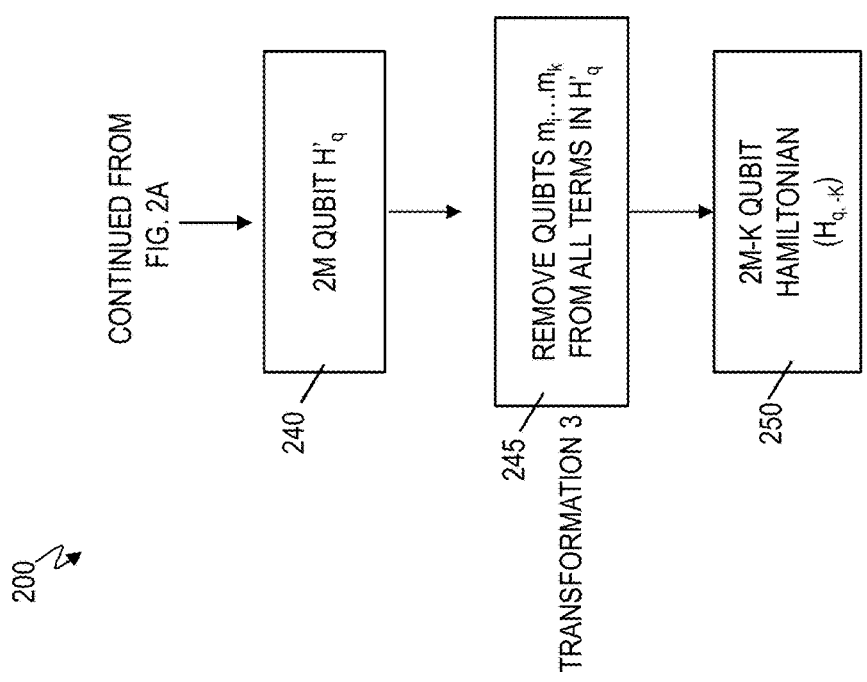
FIG. 2B REDUCTION 2:

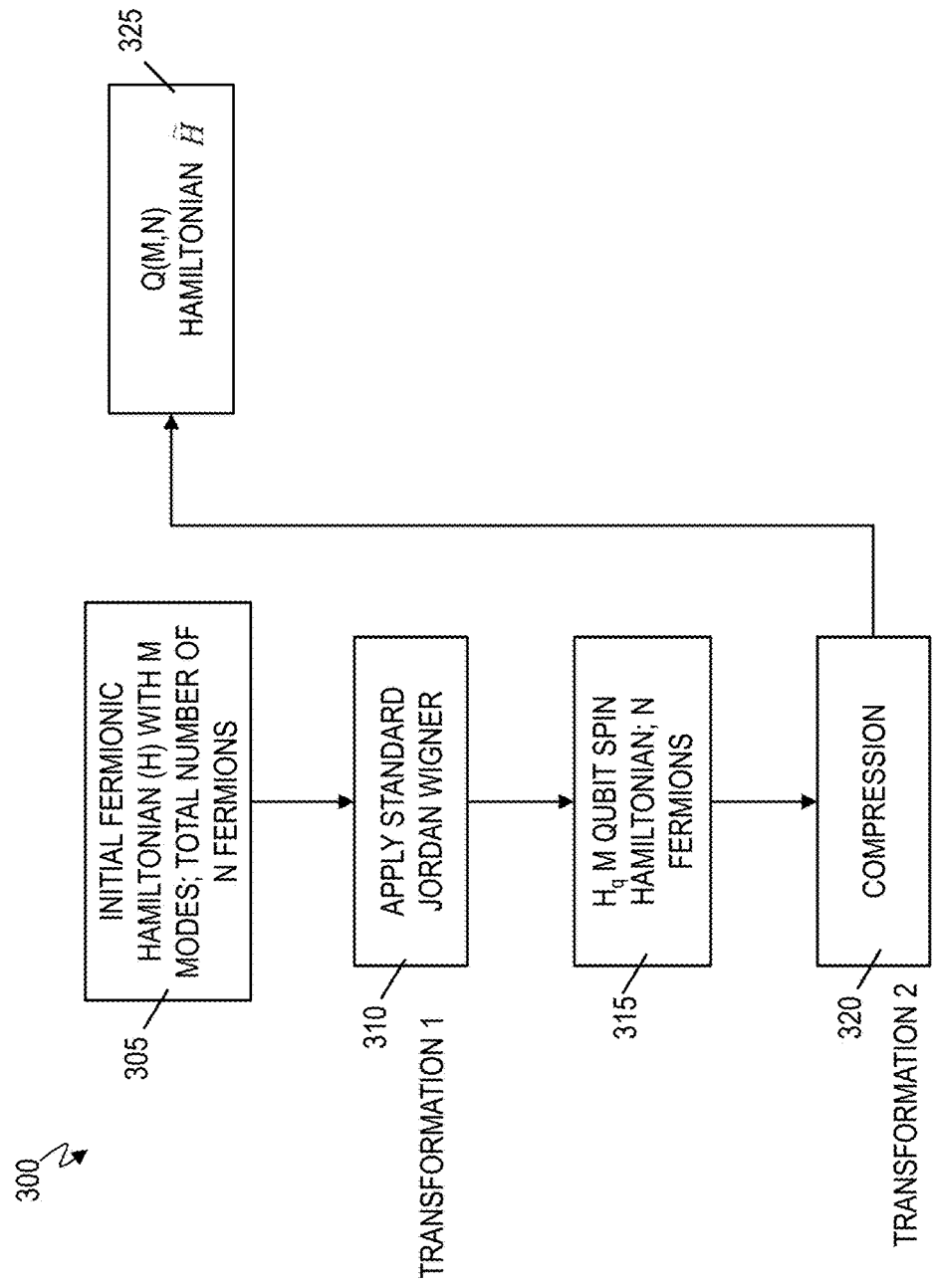
FIG. 3A  REDUCTION 3: PART 1 HAMILTONIAN COMPRESSION

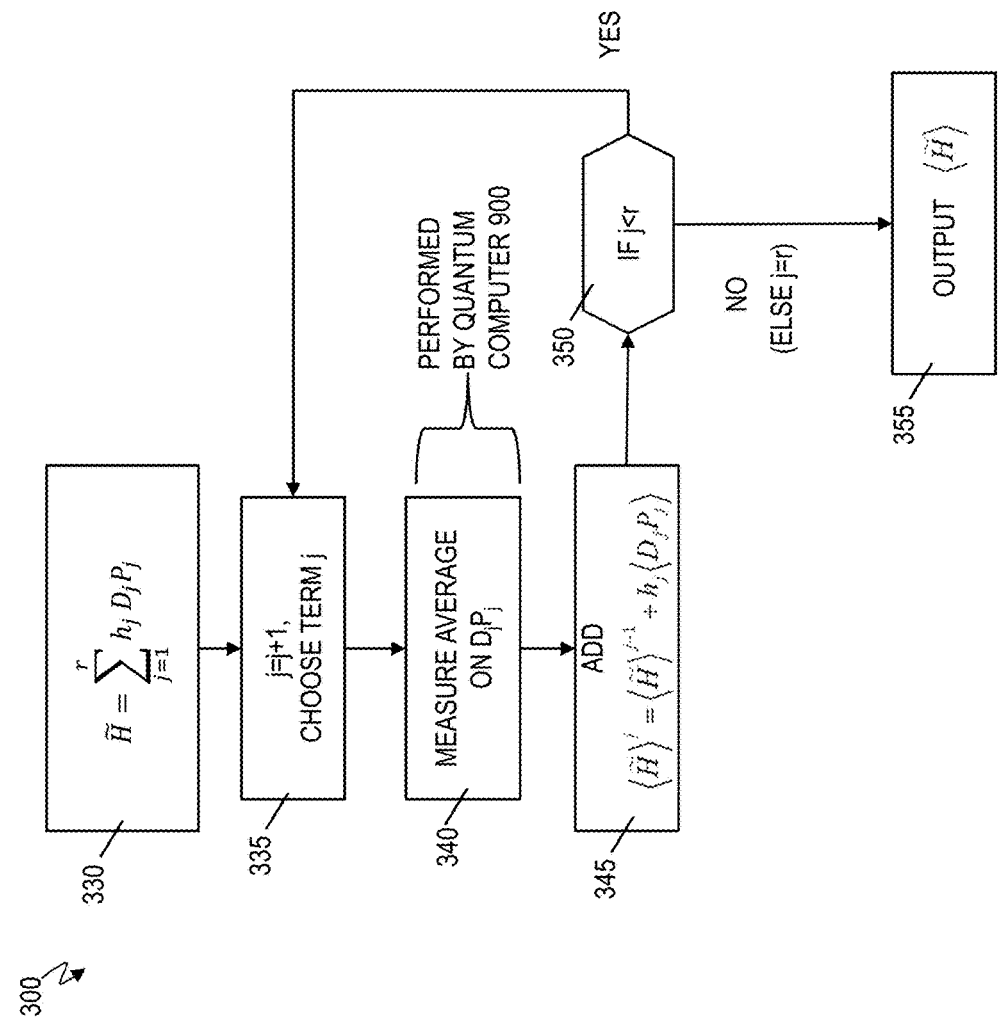
FIG. 3B  REDUCTION 3: PART 2 COMPRESSED MEASUREMENT SCHEME

FIG. 4

TABLE 1

| number of particles N \ number of fermionic modes M | 8 | 10 | 12 | 14 | 16 | 18 | 20 | 22 | 24 | 26 | 28 | 30 |
|---|---|---|---|---|---|---|---|---|---|---|---|---|
| 1 | 3 | 4 | 4 | 4 | 4 | 5 | 5 | 5 | 5 | 5 | 6 | 6 |
| 2 | 6 | 7 | 7 | 8 | 8 | 8 | 9 | 9 | 10 | 10 | 11 | 11 |
| 3 | 6 | 8 | 9 | 10 | 10 | 11 | 12 | 13 | 14 | 15 | 15 | 16 |
| 4 | 7 | 8 | 10 | 12 | 13 | 14 | 15 | 16 | 17 | 18 | 19 | 20 |
| 5 | 6 | 9 | 10 | 12 | 14 | 15 | 17 | 18 | 18 | 20 | | |

1000

CHARACTERIZE A FERMIONIC SYSTEM IN TERMS OF A HAMILTONIAN, THE FERMIONIC SYSTEM INCLUDING FERMIONS AND FERMIONIC MODES WITH A TOTAL NUMBER OF 2M FERMIONIC MODES, WHEREIN THE HAMILTONIAN HAS A PARITY SYMMETRY ENCODED BY SPIN UP AND SPIN DOWN PARITY OPERATORS 1005

→

SORTING THE FERMIONIC MODES ON THE HAMILTONIAN, SUCH THAT THE FIRST HALF OF THE 2M MODES CORRESPONDS TO SPIN UP AND THE SECOND HALF OF THE 2M MODES CORRESPONDS TO SPIN DOWN 1010

→

TRANSFORM THE HAMILTONIAN AND THE PARITY OPERATORS UTILIZING A FERMION TO QUBIT MAPPING, WHEREIN THE FERMION TO QUBIT MAPPING TRANSFORMS PARITY OPERATORS TO A FIRST SINGLE QUBIT PAULI OPERATOR ON QUBIT M AND A SECOND SINGLE QUBIT PAULI OPERATOR ON QUBIT 2M 1015

→

REMOVE THE QUBIT M HAVING BEEN OPERATED ON BY THE FIRST SINGLE QUBIT PAULI OPERATOR AND THE QUBIT 2M HAVING BEEN OPERATED ON BY THE SECOND SINGLE QUBIT PAULI OPERATOR 1020

CHARACTERIZING A FERMIONIC SYSTEM IN TERMS OF A HAMILTONIAN, THE FERMIONIC SYSTEM INCLUDING FERMIONS AND FERMIONIC MODES WITH A TOTAL NUMBER OF M FERMIONIC MODES, WHEREIN THE HAMILTONIAN HAS PARTICLE NUMBER SYMMETRY AND N PARTICLES 1205

↓

TRANSFORM THE HAMILTONIAN UTILIZING A FERMION TO QUBIT MAPPING THAT TRANSFORMS FROM M FERMIONIC MODES TO M QUBITS, WHEREIN THE M QUBITS ARE REPRESENTED BY M-BIT STRINGS IN A COMPUTATIONAL BASIS 1210

↓

APPLY A COMPRESSION MAP TO THE HAMILTONIAN SUCH THAT THE HAMILTONIAN HAVING THE M QUBITS IS MAPPED TO A TRANSFORMED HAMILTONIAN WITH Q QUBITS WHERE Q < M, WHEREIN THE COMPRESSION MAP MAPS THE M-BIT STRINGS LABELING THE M QUBITS IN THE COMPUTATIONAL BASIS WITH HAMMING WEIGHT N TO Q-BIT STRINGS 1215

EFFICIENT REDUCTION OF RESOURCES FOR THE SIMULATION OF FERMIONIC HAMILTONIANS ON QUANTUM HARDWARE

PRIORITY

This application is a continuation of U.S. patent application Ser. No. 15/437,895, filed on Feb. 21, 2017, entitled "EFFICIENT REDUCTION OF RESOURCES FOR THE SIMULATION OF FERMIONIC HAMILTONIANS ON QUANTUM HARDWARE", which claims priority from U.S. Provisional Patent Application Ser. No. 62/376,194, filed on Aug. 17, 2016, entitled "EFFICIENT REDUCTION OF RESOURCES FOR THE SIMULATION OF FERMIONIC HAMILTONIANS ON QUANTUM HARDWARE", the entire contents of which are incorporated herein by reference.

BACKGROUND

The present invention relates in general to quantum computing, and more specifically to efficient reduction of resources for the simulation of fermionic Hamiltonians on quantum hardware.

In particle physics, a fermion is any particle characterized by Fermi-Dirac statistics. These particles obey the Pauli Exclusion Principle. Fermions include all quarks and leptons, as well as any composite particle made of an odd number of these, such as all baryons and many atoms and nuclei. Fermions differ from bosons, which obey Bose-Einstein statistics. A fermion can be an elementary particle, such as the electron, or it can be a composite particle, such as the proton. According to the spin-statistics theorem in any reasonable relativistic quantum field theory, particles with integer spin are bosons, while particles with half-integer spin are fermions.

In addition to a spin characteristic, fermions also possess conserved baryon or lepton quantum numbers. Therefore, what is usually referred to as the spin statistics relation is in fact a spin statistics-quantum number relation. As a consequence of the Pauli Exclusion Principle, only one fermion can occupy a particular quantum state at any given time. If multiple fermions have the same spatial probability distribution, at least one property of each fermion, such as its spin, must be different. Fermions are usually associated with matter, whereas bosons are generally force carrier particles, although in the current state of particle physics the distinction between the two concepts is unclear. Weakly interacting fermions can also display bosonic behavior under extreme conditions. At low temperatures, fermions show superfluidity for uncharged particles and superconductivity for charged particles. Composite fermions, such as protons and neutrons, are the key building blocks of everyday matter.

SUMMARY

According to one or more embodiments, a computer-implemented method of reducing a number of qubits required on a quantum computer is provided. The method includes characterizing a Fermionic system in terms of a Hamiltonian. The Fermionic system includes Fermions and Fermionic modes with a total number of 2M Fermionic modes. The Hamiltonian has a parity symmetry encoded by spin up and spin down parity operators. The method includes sorting the Fermionic modes on the Hamiltonian, such that the first half of the 2M modes corresponds to spin up and the second half of the 2M modes corresponds to spin down, and transforming the Hamiltonian and the parity operators utilizing a Fermion to qubit mapping, where the Fermion to qubit mapping transforms the parity operators to a first single qubit Pauli operator on a qubit M and a second single qubit Pauli operator on a qubit 2M. Further, the method includes removing the qubit M having been operated on by the first single qubit Pauli operator and the qubit 2M having been operated on by the second single qubit Pauli operator.

According to one or more embodiments, a computer-implemented method of reducing a number of qubits required on a quantum computer is provided. The method includes characterizing a Fermionic system in terms of a Hamiltonian. The Fermionic system includes Fermions and Fermionic modes. The method includes transforming the Hamiltonian utilizing a Fermion to qubit mapping, finding Pauli symmetry operators of the Hamiltonian, transforming the Pauli symmetry operators into single qubit Pauli operators, and removing every qubit that the single qubit Pauli operators are acting upon.

According to one or more embodiments, a computer-implemented method of reducing a number of qubits required on a quantum computer is provided. The method includes characterizing a Fermionic system in terms of a Hamiltonian. The Fermionic system includes Fermions and Fermionic modes with a total number of M Fermionic modes, and the Hamiltonian has particle number symmetry and N particles. The method includes transforming the Hamiltonian utilizing a Fermion to qubit mapping that transforms from M Fermionic modes to M qubits, where the M qubits are represented by M-bit strings in a computational basis. Further, the method includes applying a compression map to the Hamiltonian such that the Hamiltonian having the M qubits is mapped to a transformed Hamiltonian with Q qubits where Q<M, where the compression map maps the M-bit strings labeling the M qubits in the computational basis with Hamming weight N to Q-bit strings.

According to one or more embodiments, a system is provided. The system includes memory including computer-executable instructions for reducing a number of qubits required on a quantum computer, and a processor executing the computer-executable instructions. The computer-executable instructions cause the processor to perform operations. The operations include characterizing a Fermionic system in terms of a Hamiltonian. The Fermionic system includes Fermions and Fermionic modes with a total number of 2M Fermionic modes, and the Hamiltonian has a parity symmetry encoded by spin up and spin down parity operators. The operations include sorting the Fermionic modes on the Hamiltonian, such that the first half of the 2M modes corresponds to spin up and the second half of the 2M modes corresponds to spin down. Also, the operations include transforming the Hamiltonian and the parity operators utilizing a Fermion to qubit mapping, where the Fermion to qubit mapping transforms the parity operators to a first single qubit Pauli operator on a qubit M and a second single qubit Pauli operator on a qubit 2M. Further, the operations include removing the qubit M having been operated on by the first single qubit Pauli operator and the qubit 2M having been operated on by the second single qubit Pauli operator.

According to one or more embodiments, a system is provided. The system includes memory including computer-executable instructions for reducing a number of qubits required on a quantum computer, and a processor executing the computer-executable instructions. The computer-executable instructions cause the processor to perform operations. The operations include characterizing a Fermionic system in terms of a Hamiltonian. The Fermionic system includes Fermions and Fermionic modes. The method includes transforming the Hamiltonian utilizing a Fermion to qubit mapping, finding Pauli symmetry operators of the Hamiltonian, transforming the Pauli symmetry operators into single qubit Pauli operators, and removing every qubit that the single qubit Pauli operators are acting upon.

BRIEF DESCRIPTION OF THE DRAWINGS

FIG. 1 is a flow chart of Reduction 1 according to one or more embodiments.

FIG. 2A illustrates one portion of a flow chart of Reduction 2 according to one or more embodiments.

FIG. 2B illustrates another portion of a flow chart of Reduction 2 according to one or more embodiments.

FIG. 3A illustrates one portion of a flow chart of Reduction 3 according to one or more embodiments.

FIG. 3B illustrates another portion of a flow chart of Reduction 3 according to one or more embodiments.

FIG. 4 is a table illustrating the values of Q(M,N) computed numerically for small M and N according to one or more embodiments.

FIG. 10 is a flow chart of a method of reducing (Reduction 1) a number of qubits required on and/or a number of qubit required for simulation on a quantum computer according to one or more embodiments.

FIG. 12 is a flow chart of a method of reducing (Reduction 3) a number of qubits required on (and/or a number of qubit required for simulation on) a quantum computer according to one or more embodiments.

DETAILED DESCRIPTION

Figure 5:
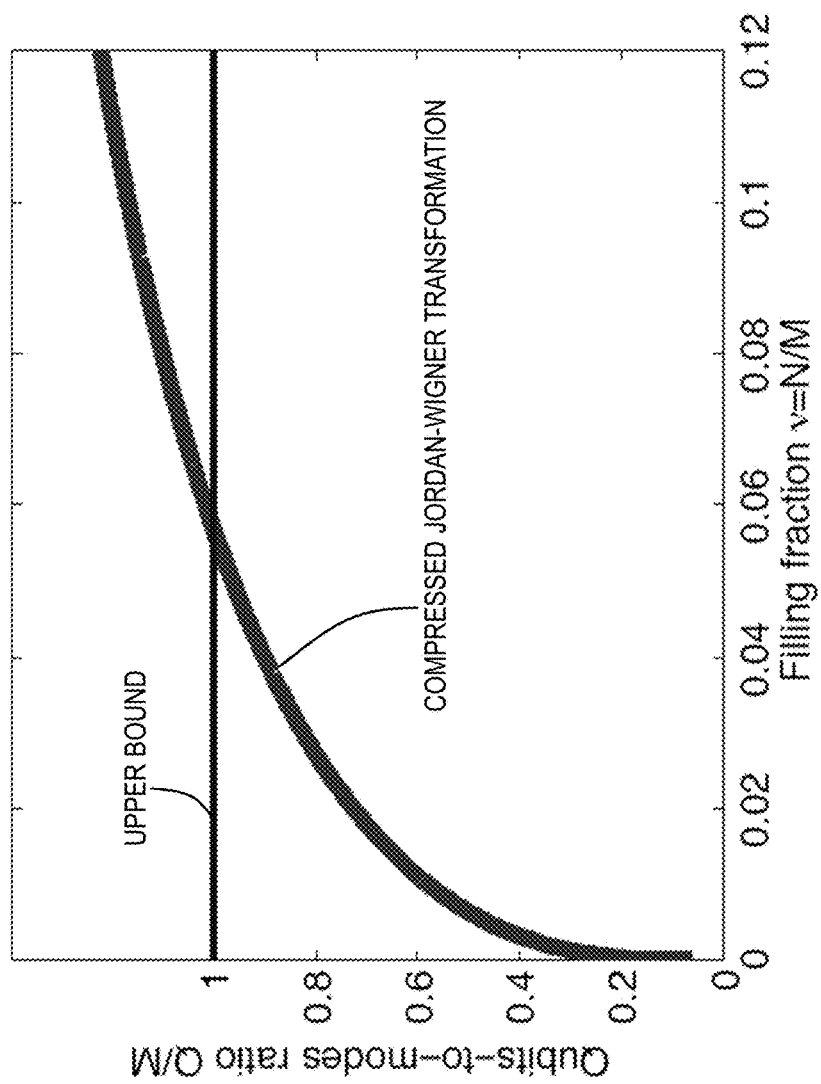
FIG. 5 depicts a graph of a compressed Jordan-Wigner transformation that has an upper bound on the qubit-to-modes ratio Q/M as a function of the filling fraction v=N/M according to one or more embodiments.

In quantum mechanics, the Hamiltonian is the operator corresponding to the total energy of the system in most of the cases. It is usually denoted by H, also Ĥ or Ĥ. Its spectrum is the set of possible outcomes when one measures the total energy of a system. Because of its close relation to the time-evolution of a system, it is of fundamental importance in most formulations of quantum theory.

Quantum information processing holds the promise of solving specific computational problems, which are deemed to be too challenging for conventional classical hardware. A computational task which is particularly well suited for quantum computers is the simulation of quantum mechanical systems. The central application here is the simulation of strongly interacting Fermionic systems, which can for instance be found in quantum chemistry, material science, and nuclear physics. In order to represent Fermionic degrees on a quantum computer, the Fermionic modes need to be mapped to qubits that are the elementary logical units of quantum computation.

Several transformations are known in the state-of-the-art that map Fermionic degrees of freedom to qubit degrees of freedom. The most prominent being the Jordan-Wigner transformation, followed by the computationally more efficient generalized Jordan Wigner transformation (Bravyi-Kitaev mapping) and the parity representation.

Common to all these transformations is that one Fermionic degree of freedom (i.e., one mode) is exactly mapped to one qubit degree of freedom (i.e., one qubit). Hence the number of qubits that are needed in this mapping is equal to the number of modes (i.e., Fermionic modes).

It is known, however, that physical Fermionic systems always obey parity conservation and in some cases the even stronger conservation of particle number. Due to these symmetries not all degrees of freedom in the qubit simulation are necessary, and in fact some qubit degrees are encoding redundant information. It has been an open question of how precisely these degrees of freedom (i.e., excess qubits) can be eliminated in a computationally efficient manner that translates directly to the removal of redundant qubit degrees of freedom in the simulation. The simulation is executed on a quantum computer having qubits. It is noted that a qubit is a physical piece of quantum hardware in a quantum computer and the qubit is a superconducting quantum device. In a Hamiltonian, the qubit is used as a term that represents the physical qubit.

One or more embodiments provide an efficient scheme that always removes two qubit degrees of freedom for any chemical Hamiltonian with negligible spin-orbit interactions. One or more embodiments provide a scheme for finding hidden symmetries, where each mutually compatible symmetry allows for the removal of a single qubit in the Hamiltonian. One or more embodiments provide a compression scheme to reduce the number of qubits relying on particle number preservation, and the compression scheme is both efficient to perform as well as asymptotically optimal.

In several specific examples, it has been observed that individual qubits could be removed from the simulation without loss of information. These observations were limited to very specific model Hamiltonians in the state-of-the-art, such as the quantum chemistry Hamiltonian of the Hydrogen molecule as well as for the Fermi-Hubbard model with four Fermionic modes. In these examples, the exact block diagonal structure of the Hamiltonian needed to be known in the state-of-the-art. Both cases do not represent a computationally efficient method of eliminating qubit degrees of freedom for generic models, thus making this elimination non-scalable and restricting the removal of qubits to the specific model systems considered in the state-of-the-art.

However, embodiments discuss computationally efficient schemes for the removal of qubits in Fermionic quantum simulations for generic Fermionic quantum many-body Hamiltonians that can be found in quantum chemistry and material science, as well as in the simulation of nuclear physics. Embodiments utilize different Fermionic mappings such as the standard Jordan-Wigner mapping as well as the generalized Jordan-Wigner mapping in order to remove the qubit degrees of freedom in the Hamilton. By removing qubit degrees of freedom in the Hamilton, embodiments remove the number of qubits that are needed in a quantum computer (also referred to as quantum hardware, quantum machine, etc.) during the execution of the Hamilton (on the qubits). For a quantum computer, qubits are a valuable and costly resource. A reduction in the number of qubits required for quantum simulations leads to a more efficient use of the available resources. A reduction enables the simulation of more complex systems than a simulation without reduction using the same quantum computational resources. According to one or more embodiments, the reduction process needs to be efficient in order to be widely applicable in quantum simulation, since an inefficient scheme would diminish the computational advantage gained from the use of a quantum computer.

Figure 8:
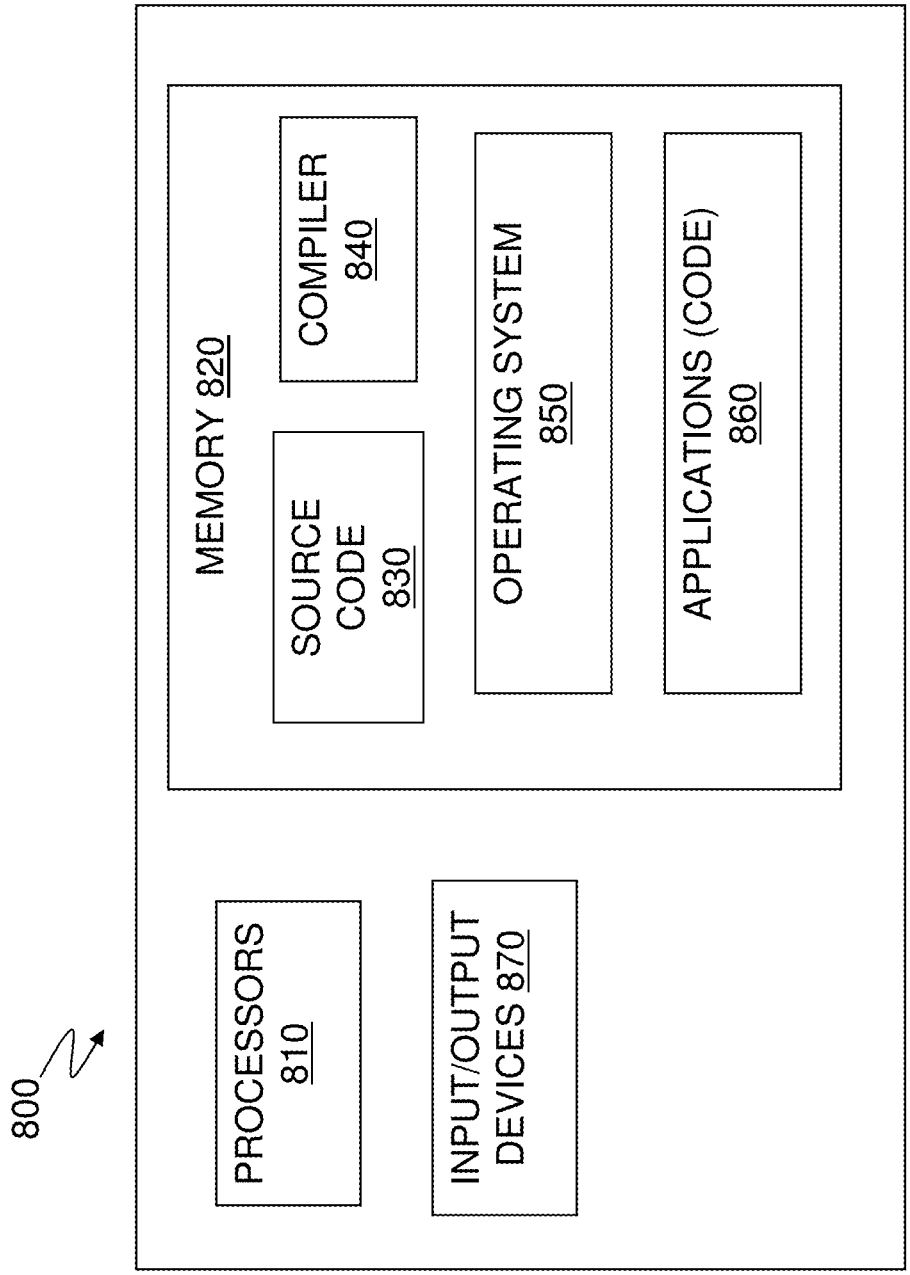
FIG. 8 is an example of a computer configured to execute the Reductions 1, 2, and/or 3, according to one or more embodiments.

According to embodiments, the input of the schemes is a Hamiltonian that encodes a system that is to be simulated. The output is a Hamiltonian with reduced degrees of freedom (i.e., corresponding to needing fewer qubits) according to embodiments. This output Hamiltonian can then be provided to a quantum algorithm that then uses fewer resources on a quantum computer. A quantum algorithm is a finite sequence of step-by-step instructions sent to the quantum computer to solve a particular problem. Here, experimenters are interested in obtaining estimates for the ground state energy of the output Hamiltonian. Therefore, this output Hamiltonian leads to a set of input data for a quantum simulation on the quantum computer. For explanation purposes and not limitation, three schemes are presented for the removal of qubit degrees of freedom (that result in fewer qubits needed in the hardware of the quantum computer), and each of the schemes has its respective advantages and works well in different scenarios in accordance with embodiments. A computer 800 in FIG. 8 is programmed and configured to execute the Reductions 1, 2, and 3. One or more software applications 860 are programmed with computer instructions of the respective Reductions 1, 2, and 3, such that processors 810 can execute them. After executing the respective Reductions 1, 2, and/or 3, the output (i.e., the output Hamiltonian) of the respective Reductions 1, 2, and/or 3 is then applied and executed on a quantum computer 900 in FIG. 9 as a Hamiltonian that needs fewer qubits than originally input (i.e., needs fewer qubits that the original Hamiltonian). It should be appreciated that a state-of-the-art quantum computer only has a limited number of qubits, such as, for example 8 qubits, on which to operate. Therefore, a Hamiltonian requiring 10 qubits cannot be simulated/executed on the 8 qubit quantum computer because the quantum hardware is limited to only 8 qubits. Embodiments are configured to perform a reduction (e.g., Reduction 1, 2, and/or 3), such that the reduced Hamiltonian only requires 8 qubits instead of the original 10 qubits, thereby creating the reduced Hamiltonian that can now be simulated/executed on the limited 8 qubits of the quantum computer. Accordingly, embodiments improve the functioning of the quantum computer itself, by providing techniques that require less quantum hardware (fewer qubits). Embodiments improve technology by allowing Hamiltonians to operate on a quantum computer, when the Hamiltonian would have otherwise been too large (i.e., required more qubits (i.e., quantum hardware)) to be applied to the limited resources of the quantum computer. Embodiments allow complex Hamiltonians to be reduced in size in order to be applied to quantum computers. Furthermore, embodiments address and solve a tangible problem that is rooted in technology, which is a quantum computer having a limited number of computational resources (i.e., limited number of qubits) while the Hamiltonian requires more computational resources than available. Without being able to reduce the Hamiltonian to a size that utilizes fewer qubits (quantum hardware), the system represented by the Hamiltonian could not be simulated on the quantum computer.

It is noted that headings and/or subheadings are utilized herein for explanation purposes below and not limitation.

1) Reduction 1: Removal of Parity conserving qubits in the generalized Jordan-Wigner transformation.

A high-level description of Reduction 1 is provided now but a detailed description of the Reduction 1 can be found below. Reduction 1 preserves the locality, i.e., the weight of the Pauli operators in the Hamiltonian after the generalized Jordan-Wigner transformation and eliminates (exactly) two qubits from any Fermionic Hamiltonian that preserves the spin-parity of the electrons, thereby eliminating the need for two qubits in the quantum computer. This in particular applies to chemical Hamiltonians for the electronic structure problem without spin-orbit coupling. The Reduction 1 works as follows: The Hamiltonian acts on a space of $2_M = 2^k$ (k=1, 2, . . . ) spin orbitals. Experimenters sort the orbitals so that the first labels 1 to M all correspond to spin up, while the remaining labels M+1 to 2M correspond to spin down. One can now express the parity operators P1 for the first M spin-down orbitals and P2 for the remaining M spin-up orbitals. By transforming the Fermionic mode operators into spin degrees of freedom by means of the generalized Jordan-Wigner transformation, one can show that the first parity operator P1 acts as a simple Pauli Z-matrix on qubit M, i.e., $P1 = Z_M$, while the second operator P2 is a simple product of two Pauli Z matrices at sites M and 2M, i.e., P2=ZM Z2M. Since experimenters have assumed spin parity preservation in every term of the Hamiltonian both P1 and P2 commute with every term in the transformed Hamiltonian. This implies that the Pauli operator on this site (e.g., sites M and/or 2M) can only be the identity matrix or the Pauli Z-matrix in each term, since these are the only possible operators that commute with P1 and P2 at these positions. The structure of every term in the Hamiltonian is now simpler since the action of these qubits in the simulation is known beforehand (i.e., predefined). Hence, since experimenters know the spin parity of the electrons beforehand, the experimenters can remove these two qubits and replace the terms with the eigenvalues (+/−1) depending on the parity. The two qubits only encoded the value of the spin parity in the simulation, which is information that is known before (i.e., predefined) the experimenters begin the simulation. The removal of the qubits means the need for fewer qubits in the quantum hardware, and as a consequence, this amounts to a direct removal of redundant information.

FIG. 1 is a flow chart 100 of Reduction 1 according to one or more embodiments. The techniques of Reduction 1 can be executed (as application 860) on computer 800. Given an initial Fermionic Hamiltonian H on 2M modes, compare Eq. (1), the experimenters apply a sequence of transformation 1-3 to transform the Hamiltonian into a qubit Hamiltonian for quantum simulation on 2M−2 qubits. The Reduction 1 is executed on computer 800, while the quantum simulation (via the reduced Hamiltonian, which is the Hamiltonian that requires fewer qubits to be executed) is executed on the quantum hardware of the quantum computer 900.

At block 105, the input (via application 806) on the computer 800 is a 2M Fermionic spin-orbit Hamiltonian H (Eq. (1)). This is a Fermionic Hamiltonian H on 2M modes.

At block 110, the computer 800 is configured to transform from Hamiltonian H to Hamiltonian H' (H→H') by sorting the spin orbitals and labeling 1 . . . M as spin-up orbitals and labeling M+1 ... 2M as spin-down orbitals. This is sorting 2-M Fermionic Modes, and results in the Hamiltonian H' at block 115.

At block 120, the computer 800 is configured to transform Hamiltonian H' to $H_q$ (H'→$H_q$) by applying the generalized Jordan-Wigner (Bravyi-Kitaev) transformation to obtain 2M qubit Hamiltonian $H_q$ (at block 125). Reference can be made to "The Bravyi-Kitaev transformation for quantum computation of electronic structure" by Jacob T Seeley, Martin J Richard, and Peter J Love, in The Journal of Chemical Physics, 137(22):224109, 2012, which is herein incorporated by reference.

At block 130, the computer 800 is configured to transform Hamiltonian $H_q$ to $H_{q,-2}$ ($H_q$→$H_{q,-2}$) by removing a qubit with label M and removing a qubit with label 2M in every term of the Hamiltonian $H_q$, and after the removing operations, then multiplying the term with the appropriate eigenvalue +/−1. The appropriate eigenvalue +/−1 is known because the eigenvalue only encodes the value of the spin parity which is data that is available before (predefined) the experimenters start the simulation. At block 135, the output is a 2M−2 qubit Hamiltonian $H_{q,-2}$ (See Eq. (6) below), which is applied to the quantum computer 900.

2) Reduction 2: Algorithmic reduction of qubit degrees of freedom by the construction of non-local commuting Pauli matrices.

A high-level description of Reduction 2 is provided now but a detailed description of the Reduction 2 can be found below. Reduction 2 can increase the locality of the Pauli operators of the transformed Hamiltonian. However, Reduction 2 leaves the total number of summands in the Hamiltonian invariant. The qubit Hamiltonian is written as a sum of Pauli matrices. The reduction does not change the form of the sum and does not introduce new terms one needs to sum over after the transformation. However, it does change the form of the individual terms and maps the Pauli operators to Pauli operators that each on its own is now acting on more qubits jointly. Reduction 2 can be applied to all the considered Fermion to qubit transformations, in particular to the generalized Jordan-Wigner transformation as well as to the standard Jordan-Wigner transformation. The Reduction 2 works as follows: It is a well-known fact that the N-qubit Pauli group is isomorphic to the direct group product of 2N+2 copies of integers modulo two. (In mathematics, an isomorphism is a homomorphism or morphism (i.e., a mathematical mapping) that admits an inverse.) This isomorphism can be used to encode every Pauli into a 2N bit string, dropping the phase dependence and thus dropping 2 bits.

After the mapping of Fermionic mode operators to Pauli matrices has been performed, it is possible to arrange the representations into a binary matrix. From this, a dual parity check matrix can be constructed by exchanging blocks and transposition as explained in the detailed Reduction 2. The kernel of this parity check matrix over the finite field of bits corresponds to bit strings which encode Pauli matrices that commute with every term in the Hamiltonian (two elements commute when changing the order of the operands does not change the result). It is noted that the kernel is the null space of this matrix, and the kernel is a set that is formed of all the factors that get mapped to zero by the matrix. The kernel can be determined by simple Gaussian elimination, which is an efficient reduction and scales polynomially in the number of modes and terms in the Hamiltonian. Once the kernel is determined, one can easily construct a Clifford group element for every linearly independent bit string in the kernel so that the corresponding non-local Pauli operator is mapped onto a single qubit Pauli matrix. This Clifford group element is defined in the detailed Reduction 2. This single qubit Pauli operator (i.e., non-local Pauli operator) now commutes by construction with all terms in the Hamiltonian, and hence the experimenters are in the scenario of Reduction 1 again. This qubit can now be removed and the removed qubit can be replaced by a corresponding (+/−1) eigenvalue, which however unlike in Reduction 1 needs to be determined by simulation. In Reduction 1 the value could be computed before the experimenters start the simulation by counting the particles in each spin orbital. In the present Reduction 2, where experimenters can also discover symmetries that are not known beforehand, this number is determined after the simulation is complete so that the total energy becomes minimal.

FIGS. 2A and 2B depict a flow chart 200 of Reduction 2 according to one or more embodiments. The techniques of Reduction 2 can be executed (as application 860) on computer 800. Given an initial Fermionic Hamiltonian H on 2M modes (compare Eq. (1) herein), the experimenters apply a sequence of transformations 1, 2, and 3 to transform the Hamiltonian into a qubit Hamiltonian for quantum simulation on 2M−k qubits, where k is determined by the present Z2 symmetries. As noted above, the Reduction 2 is executed on computer 800, while the quantum simulation (via the reduced Hamiltonian, which is the output Hamiltonian that requires fewer qubits to be executed) is executed on the quantum hardware of the quantum computer 900.

At block 205, the input (via application 806) on the computer 800 is a 2M Fermionic spin-orbit Hamiltonian H (See Eq. (1) herein). This means a Fermionic Hamiltonian H on 2M modes.

At block 210, the computer 800 is configured to transform from Hamiltonian H to $H_q$ (H→$H_q$) by applying the standard Jordan-Wigner or generalized Jordan-Wigner transformation to obtain 2M qubit Hamiltonian (at block 215). This is a mapping of fermions to qubits. Although the standard Jordan-Wigner and/or generalized Jordan-Wigner (Bravyi-Kitaev) transformation are discussed, it should be appreciated that other mapping techniques can be utilized such as, e.g., working in the parity basis or any other binary basis.

Branching from block 215, the computer 800 is configured to encode the Pauli operators in $H_q$ into a $F_2$ parity check matrix E at block 220 and determine the largest commuting set of Pauli operators $\{g_j\}$ in the kernel of E (at block 225). If k>0 Pauli operators have been found, the flow proceeds to block 225. If no Pauli operators have been found, the computer 800 is configured to abort this reduction scheme at block 221. The Pauli operators $\{g_j\}$ are the symmetry operators of the terms in the Hamiltonian and are used to construct a set of operators to remove the redundant qubits. If no symmetries can be found, i.e., k=0, the scheme cannot remove further qubits from the Hamiltonian.

At block 230, the computer 800 is configured to construct Clifford maps for every commuting Pauli vector $\{g_j\}$, where j=1 ... k labeled $C_j$ and apply the Clifford transformations to $H_q$ to obtain $H_q'$ mapping $g_j$ to single qubit Paulis on sites $m_1$ ... $m_k$ at block 235.

At block 235, the computer 800 is configured to transform from Hamiltonian $H_q$ to $H_q'$ ($H_q$→$H_q'$) by finding the Z2 symmetries in the Hamiltonian and by constructing a Clifford transformation. Z2 symmetries refer to symmetries in the Hamiltonian.

The result of block 235 is 2M qubit Hamilton $H_q'$ at block 240.

At block 245, the computer 800 is configured to transform from Hamiltonian $H_q'$ to $H_{q,-k}'$ ($H_q'$→$H_{q,-k}'$) by removing qubits with labels $m_1 \ldots m_k$ in every term of the Hamiltonian $H_q'$ and by multiplying the term with the appropriate eigenvalue +/−1.

At block 250, the output is a 2M−k qubit Hamiltonian $H_{q,-k}$ (See Eq. (10) herein), which is applied to the quantum computer 900.

3) Reduction 3: compressed Jordan-Wigner transformation for fermionic Hamiltonians preserving the particle number.

A high-level description of Reduction 3 is provided now but a detailed description of the Reduction 3 can be found below. Reduction 3 maps a local fermionic operator preserving the number of particles to a non-local qubit operator that can be represented as a product of a local Pauli and a non-local diagonal operator. The Reduction 3 is applied separately to each term in the Hamiltonian. Assuming that the fermionic system to be simulated consists of M orbitals occupied by N electrons, the transformed Hamiltonian describes a system of Q qubits, where Q<M is a certain function of M and N. The experimenters provide a table (Table 1 in FIG. 4) of values for the function Q(M,N), for small values of M and N, as well asymptotic upper bounds on Q in the detailed Reduction 2. In particular, experimenters show that the Reduction 3 allows one to accomplish the simulation (on the quantum computer 900) with less than M−2 qubits. The Reduction 3 works by composing the standard Jordan-Wigner transformation and a linear injective compression map that sends M-bit strings with the Hamming weight N to Q-bit strings. Experimenters utilize a practical algorithm for computing the inverse of the compression map. The transformed Hamiltonian has the locality properties stated above that the binary matrix describing the compression map is a parity check matrix of a Low Density Parity Check (LDPC) code encoding M−Q bits into M bits with the minimum distance 2N+1. The transformed Hamiltonian thus has known constructions of LDPC codes with a constant encoding rate and a constant relative distance yield compressed Jordan-Winger transformations with constant fractions Q/M and N/M. Finally, experimenters show how to use the transformed Hamiltonian in quantum simulations algorithms based on the variational approach where a quantum computer (e.g., quantum computer 900) is used to measure the energy of a given Q-qubit variational state.

FIGS. 3A and 3B depict a flow chart 300 of Reduction 3 according to one or more embodiments. The techniques of Reduction 3 can be executed (as application 860) on computer 800. As noted above, the Reduction 3 is executed on computer 800, while the quantum simulation (via the reduced Hamiltonian, which is the Hamiltonian that requires fewer qubits to be executed) is executed/simulated on the quantum hardware of the quantum computer 900.

FIG. 3A depicts the Hamiltonian compression (part 1) according to one or more embodiments. In FIG. 3A, at block 305, the computer 800 is configured to receive (via application 806) an input of an initial M Fermionic spin-orbit Hamiltonian H (See Eq. (11) herein) with N occupying Fermions. This is Hamiltonian H with M modes and a total of N Fermions.

At block 310, the computer 800 is configured to transform the Hamiltonian H to $H_q$ ($H \rightarrow H_q$) by applying the standard Jordan-Wigner to H to obtain an M-qubit Hamiltonian $H_q$, thereby resulting in $H_q$ M qubit spin Hamiltonian with N Fermions at block 315.

At block 320, the computer 800 is configured to apply isometry U to the Hamiltonian, which stems from LDPC compression in Eq. (16). As a result of the LDPC compression, the computer 800 is configured to output a Q(M,N) qubit Hamiltonian H from Eq. (13) herein at block 325. For example, at block 325, the computer 800 can read the value for Q(M,N) from Table 1 (e.g., stored in and/or accessed by computer 800) in FIG. 4, with asymptotic scaling as in Eq. (12), thereby resulting in the compressed Hamiltonian $\tilde{H}$ that is utilized in FIG. 3B. In this case, the compressed Hamiltonian $\tilde{H}$ ( ) is utilized for simulation on the quantum computer 900, using a scheme discussed in FIG. 3B.

FIG. 3B depicts the compressed measurement scheme (part 2) according to one or more embodiments. The measurement scheme of (block 340) is performed on a quantum computer 900 to obtain the measurement values as part of the simulation. The computer 800 is used to add the obtained values to the final result. Unlike FIGS. 1, 2A, 2B, 3A, FIG. 3B is performing the simulation on the quantum computer 900.

In FIG. 3B, at block 330, the computer 800 is configured to receive input of the compressed Hamiltonian $\tilde{H} = \sum_{j=1}^{r} h_j D_j P_j$, with j=1 ... r terms. The computer 800 sets j=0 and $\langle \tilde{H} \rangle = 0$. The experimenters define <H> as the expectation value that is needed to compute from the measurement data. This value is initially set to zero and computed as part of the scheme.

At block 335, the computer 800 is configured to set j=j+1, and choose Hamiltonian term $D_j P_j$.

The quantum computer 900 is configured to the measure expectation value in Eq. (14) (herein) at block 340, and return $\langle D_j P_j \rangle$ to then be applied to the computer 800. A classical computer 800 provides input data for the quantum computer 900 to perform the simulation. The quantum computer 900 samples the measurement results to estimate the expectation value $\langle D_j P_j \rangle$. The measurement scheme to obtain the expectation value is explained below in the detailed Reductions 3. This output measurement data performed on the quantum computer 900 (at block 340) is fed back to the computer 800 at block 345.

At block 345, the computer 800 is configured to add to $\langle H \rangle$ where $\langle \tilde{H} \rangle = \langle \tilde{H} \rangle^{j-1} + h_j \langle D_j P_j \rangle$.

At block 350, the computer 800 is configured to check if j<r. If yes, j<r the process proceeds back to block 335. If no, the computer 800 is configured to proceed with else j=r and output estimate ⟨H⟩ at block 355. The output is the energy estimate ⟨H⟩ of the Hamiltonian $\tilde{H}$.

It should be appreciated that a high-level discussion of Reductions 1, 2, and 3 have been discussed above, and further details of the Reductions are discussed below. First, further details are Reduction 1 are discussed.

Detailed Reduction 1

The experimenters now consider the removal of two qubits in molecular Hamiltonians that preserve spin-parity after a generalized Jordan-Wigner transformation. Reference can be made to "Fermionic quantum computation" by S. Bravyi and A. Kitaev., in Ann. of Phys., 298(1): 210-226, 2002, which is herein incorporated by reference.

The molecular orbitals of the addressed molecular Hamiltonian are considered in second quantization. Now, consider the most general non-relativistic Fermionic Hamiltonian, which can be written as $$H = \sum_{\sigma=\{\uparrow,\downarrow\}} \sum_{\alpha,\beta=1}^{M} h_{\alpha\beta} \, a_{\alpha\sigma}^\dagger a_{\beta\sigma} + \quad \text{Eq. (1)}$$

$$\frac{1}{2} \sum_{\sigma,\rho=\{\uparrow,\downarrow\}} \sum_{\alpha,\beta,\gamma,\mu=1}^{M} U_{\alpha\beta\gamma\mu} \, a_{\alpha\sigma}^\dagger a_{\beta\rho}^\dagger a_{\gamma\rho} a_{\mu\sigma},$$

with $h_{\alpha,\beta}, U_{\alpha\beta\gamma\mu} \in \mathbb{C}$ being the one and two-electron Fermionic integrals which obey the correct symmetries for a valid molecular Hamiltonian, with the underlying anti commutation rules for the Fermionic modes $\{a_{\alpha\sigma}^\dagger, a_{\beta\rho}\} = \delta_{\alpha,\beta}\delta_{\sigma,\rho}$ and $\{a_{\alpha,\sigma}^\dagger, a_{\beta\rho}^\dagger\} = \{a_{\alpha\sigma}, a_{\beta\rho}\} = 0$. Each molecular orbital $\alpha$ here is two-fold spin degenerate, with $\sigma = \{\uparrow, \downarrow\}$ labelling the spin state, so that the Hamiltonian in Eq. (1) preserves the total number of spins. The Preservation of spin parity corresponds to the fact that the operators $$p_\downarrow = \prod_{\alpha=1}^{M} (1 - 2a_{\alpha\downarrow}^\dagger a_{\alpha\downarrow}) \text{ and } p_\uparrow = \prod_{\alpha=M+1}^{2M} (1 - 2a_{\alpha\uparrow}^\dagger a_{\alpha\uparrow}) \qquad \text{Eq. (2)}$$

are symmetries of the Hamiltonian, $[p_{\uparrow\downarrow}, H] = 0$. To simulate H on a quantum computer (e.g., quantum computer 900) the experimenters employ the generalized Jordan-Wigner transformation. The transformation maps the fermionic operators $a_{\alpha\sigma}^\dagger, a_{\alpha\sigma}$ to a low-order linear combination of Pauli matrices in $\mathcal{P}_{2M} = \langle i1, X_1, Z_1, \ldots, X_{2M}, Z_{2M}\rangle$, where $X_i$, $Z_i$ acts as a single qubit Pauli-X and Pauli-Z matrix on the i-th qubit, for a total of 2M qubits. In its original formulation this transformation requires that the total number of modes 2M is a power of two, i.e., $2M = 2^k$ for $k = 1, 2, \ldots$. The experimenters make this assumption from now on. This generalized Jordan-Wigner mapping can be stated as $$a_i^\dagger \to \tfrac{1}{2}(X_{U(i)} \otimes X_i \otimes Z_{P(i)} - iX_{U(i)} \otimes Y_i \otimes Z_{\rho(i)})$$

$$a_i \to \tfrac{1}{2}(X_{U(i)} \otimes X_i \otimes Z_{P(i)} + iX_{U(i)} \otimes Y_i \otimes Z_{\rho(i)}), \qquad \text{Eq. (3)}$$

where the experimenters have chosen the ordering of the 2M Fermionic modes such that $(a_i, a_i^\dagger) \equiv (a_{\alpha\uparrow}, a_{\alpha\uparrow}^\dagger)$ for $i \in \{1, M\}$ and $\{a_i, a_i^\dagger\} \equiv (a_{\alpha\uparrow}, a_{\alpha\downarrow}^\dagger)$ for $i \in \{M+1, 2M\}$. For a definition of the update, parity, and remainder subsets of qubits U(i), P(i) and $\rho(i)$ see "The Bravyi-Kitaev transformation for quantum computation of electronic structure". This transformation maps the Hamiltonian H to a sum of Hermitian Pauli vectors, so that the experimenters can write H in terms of qubit degrees of freedom as $$H_q = \sum_A h_A \, \sigma_A, \qquad \text{Eq. (4)}$$

where $\sigma_A \in \mathcal{P}_{2M}$, and $h_A \in \mathbb{R}$ can be computed as a linear combination from the Hamiltonian coefficients $h_{\alpha,\beta}$, $U_{\alpha\beta\gamma\mu}$. One can verify, that the symmetry operators $p_{\uparrow\downarrow}$ will transform, accordingly to Eq. (3), to $$p_\uparrow = Z_M \text{ and } p_\downarrow = Z_{2M} Z_M. \qquad \text{Eq. (5)}$$

Since the experimenters have that $[p_{\uparrow\downarrow}, H] = 0$ and $p_\square = Z_M$ as well as $p_\downarrow p_\uparrow = Z_{2M}$ are single qubit operators, they commute with every term in the Hamiltonian so that $[p_{\uparrow\downarrow}, \sigma_A] = 0$ for all A. Note the fact that these operators are single qubit operators strongly depends on the fact that 2M is a power of two. In some cases, however, it is possible to implement a version of the generalized Jordan-Wigner transformation for mode numbers that do not satisfy this criterion any longer. In this case the Pauli representation of $p_{\downarrow\uparrow}$ will become delocalized and contain higher weight Pauli operators. In this case, however, a Clifford transformation can be found which can map these symmetries to local Pauli's again, as will be explained in the section below for Reduction 2. Returning to Reduction 1, since the final Pauli operator encoding this symmetry is in either case a single qubit Pauli, the experimenters can replace these operators by their eigenvalues, which only depend on the number N of electrons in spin-up $\uparrow$ and spin-down $\downarrow$ orbitals. The experimenters know this number in the case of molecular Hamiltonians without spin coupling, where the number of total spin degrees of freedom in the $\downarrow, \uparrow$ state is a symmetry of $H_q$. The eigenvalue for $p_\uparrow, p_\downarrow$ is $\pm 1$, and can be therefore evaluated and stated in each Pauli operator as $(-1)^{\varphi_{M,2M}^A}$, so that one can reduce the 2M qubit Hamiltonian to $H_{q,-2}$ on 2M-2 qubits $$H_{q,-2} = \sum_A (-1)^{\varphi_{M,2M}^A} h_A \sigma_{A \setminus \{M, 2M\}}. \qquad \text{Eq. (6)}$$

Here $\sigma_{A \setminus \{M, 2M\}}$ means that the qubits M, 2M are removed from $\sigma_A$. As should be appreciated, Eq. (6) is the end result of block 135 in Reduction 1.

Now, turning to Reduction 2, a high-level discussion of Reduction 2 was provided above, and now further details of Reduction 2 are provided below.

Detailed Reduction 2

This reduction scheme can be seen as a generalization of the scheme Reduction 1. Reduction 2 can be applied to either the standard or the generalized Jordan Wigner transformation. Reference to the standard Jordan-Wigner transformation can be found in "Über das Paulische Äguivalenzverbot" by E. Wigner and P. Jordan, in Z. Phys, 47:631, 1928, which is incorporated by reference. Although this publication is only available in German, the English translation is "About the Pauli exclusion principle" by Eugene P. Wigner and P. Jordan, in Z. Phys 47.631 (1928): 14-75. It is assumed that there is a fermionic Hamiltonian with M modes so that the experimenters can map it by the aforementioned transformations to $$H_q = \sum_A h_A \, \sigma_A, \qquad \text{Eq. (7)}$$

where again $h_A \in \mathbb{R}$ and $\sigma_A \in \mathcal{P}_M$. The experimenters now look for k Hermitian commuting Pauli operators $g_1, \ldots, g_k \in \mathcal{P}_M$ that constitute a subset symmetries of the Hamiltonian $H_q$ so that $[g_j, \sigma_A] = 0, \forall A, j$ and $[g_i, g_j] = 0, \forall i, j$. If some symmetries $g_j$ are found, the experimenters construct for each of them ($g_j$) a Clifford transformation $\mathcal{C}_j$ that maps $g_j$ to a single qubit Pauli matrix at site j. Then, for every $g_j$ the experimenters search for a single qubit Pauli matrix acting on site $m_j$ as $\sigma_{m_j} \in \{X_{m_j}, Y_{m_j}, Z_{m_j}\}$ so that $\{g_j, \sigma_{m_j}\} = 0$ and $[g_j, \sigma_{m_i}] = 0, \forall i \neq j$ For every pair $(g_j, \sigma_{m_j})$ the experimenters define the Clifford operation $\mathcal{C}_j$ as $$C_j = \frac{1}{\sqrt{2}}(\sigma_{m_j} + g_j), \text{ with } C_j^\dagger = C_j, \qquad \text{Eq. (8)}$$

$$C_j^2 = 1, \text{ so that } C_j g_j C_j = \sigma_{m_j}.$$

The experimenters can now map the Hamiltonian H to $$H' = C_1 \ldots C_k H C_k \ldots C_1 = \sum_{A'} h_{A'} \, \sigma_{A'}, \qquad \text{Eq. (9)}$$

which now has the single qubit Pauli operators $\sigma_{m_1}, \ldots, \sigma_{m_k}$ as symmetries. By the same argument as in Reduction 1, the qubits supported on $\sigma_{m_1}, \ldots, \sigma_{m_k}$ can be removed from $H_q$ and be replaced by their eigenvalues (±1). Hence, the Hamiltonian originally defined to act on M qubits can now be represented on M−k qubits. That is, the experimenters can write $$H_{q,-k} = \sum_{A'} (-1)^{\varphi^{A'}_{m_1,\ldots,m_k}} h_{A'} \sigma_{A' \setminus \{m_1,\ldots,m_k\}}. \qquad \text{Eq. (10)}$$

This Reduction 2 scheme encompasses Reduction 1 as a special case. It can however happen that the Clifford operations $C_j$ map the low weight Hamiltonian obtained from the generalized Jordan-Wigner transformation to a non-local operator, depending on the specific problem of interest. It should be recognized that the 2M−K qubit Hamiltonian in block 250 is defined as in $H_{q,-k}$ in Eq. 10.

The operators $g_j$ can be constructed from the parity check matrix E that is associated with the set of Pauli matrices $\{\sigma_A\}_{\{A \in H_q\}}$. A well-known isomorphism $\mathbb{F}_2$ between $\mathcal{P}_M \cong \mathbb{Z}_2^2 \times \mathbb{Z}_2^{2M}$ can be used to construct the $(2M) \times \#\{A \in H_q\}$ dimensional binary code matrix $G=[G_Z, G_X]$. This matrix $G=[G_Z, G_X]$ is a collection of the encoded bitstrings of all the $\sigma_A$ in column space. The kernel over $\mathbb{F}_2$ of the dual parity check Matrix $E=[G_X^T; G_Z^T]$ is then spanned by the commuting Pauli operators $\{g_j\}_{j=1,\ldots,k}$.

Last, a high-level discussion of Reduction 3 was provided above, and no further details of Reduction 3 are provided below.

Detailed Reduction 3

This reduction applies to general fermionic Hamiltonians preserving the total number of particles. Let M and N be the number of fermionic modes and the number of particles (occupied modes), respectively. The experimenters consider the N-particle sector of the Fock space spanned by basis states $|x_1, x_2, \ldots, x_M\rangle$, where $x_\alpha=0,1$ is the occupation number of the mode $\alpha$ and $\Sigma_{\alpha=1}^M x_\alpha = N$. Note that M now denotes the total number of modes (including the spin). Our goal is to simulate a fermionic Hamiltonian $$H = \sum_{j=1}^r h_j V_j \qquad \text{Eq. (11)}$$

where each term $V_j$ has a form $a_\alpha^\dagger a_\beta + a_\beta^\dagger a_\alpha$ or $a_\alpha^\dagger a_\beta^\dagger a_\gamma a_\delta + a_\delta^\dagger a_\gamma^\dagger a_\beta a_\alpha$ for some $1 \le \alpha \le \beta \le \gamma \le \delta \le M$, and $h_j$ are real coefficients. Without loss of generality $N \le M/2$. Otherwise, perform a transformation $a_\alpha \leftrightarrow a_\alpha^\dagger$ as for all $\alpha$ that exchanges particles and holes. Here, the experimenters describe a Compressed Jordan-Wigner transformation that maps H to a new Hamiltonian $\tilde{H}$ describing a system of Q<M qubits, where Q=Q(M,N) is a certain function of M and N. The ground state energy of $\tilde{H}$ coincides with the ground state energy of H restricted to the N-particle sector. FIG. 4 shows the values of Q(M,N) computed numerically for small M and N. FIG. 4 is Table 1 that represents a compressed Jordan-Wigner transformation. Table 1 shows that Fermi system with M modes and N particles can be simulated on a quantum computer with Q+1 qubits, where Q=Q(M,N). It should be recall that Q denotes the number of qubits needed to represent the Hamiltonian after the compression. While M denoted the original number of fermionic modes that can be occupied by or in a total of N Fermions. Table 1 shows the values of Q(M,N) for a set of pairs N in the left column and M in the top row.

The experimenters also derive an asymptotic upper bound on Q(M,N) in the case when M, N go to infinity such that the filling fraction $v=N/M$ stays constant. Namely, the experimenters show that for any constant $0<v<¼$ one has $$Q \le 6vM \exp[h(2v)/3v-1], \qquad \text{Eq. (12)}$$

where $h(x) = -x \log(x) - (1-x) \log(1-x)$ is the Shannon entropy function (here the experimenters use the natural logarithms). The qubits-to-modes ratio Q/M is shown as a function of the filling fraction $v$ on FIG. 5. FIG. 5 depicts a graph of a compressed Jordan-Wigner transformation that has an upper bound on the qubit-to-modes ratio Q/M from Eq. (12) as a function of the filling fraction $v=N/M$ in the limit M, N→∞. As one can see, Q/M<1 whenever $v$ is below a threshold value $v_0 \approx 0.057$. The experimenters do not expect that the bound in Eq. (12) is tight. With specialization to quantum chemistry Hamiltonians, the number of qubits required for the simulation is $Q(M,N_\uparrow)+Q(M,N_\downarrow)$, where M is the number of spatial orbitals (i.e., half the number of modes) and $N_{\uparrow\downarrow}$ is the number of electrons with spin up and spin down. To describe the new Hamiltonian $\tilde{H}$, the experimenters introduce more notations. For each term $V_j$ let $v_j=0$, 1, 2 be the maximum number of particles that can be moved by $V_j$. In other words, all diagonal operators have $v_j=0$, hopping and the controlled hopping operators have $v_j=1$, while double hopping operators have $v_j=2$. Then $$\tilde{H} = \sum_{j=1}^r h_j D_j P_j \qquad \text{Eq. (13)}$$

for some hermitian operators $D_j$, $P_j$ with the following properties:

(1) $D_j$ is a diagonal operator with matrix elements 0, ±1.
(2) $P_j$ is an X-type Pauli operator of weight at most $6v_j$.
(3) $P_j D_j = D_j P_j$.

The coefficients $h_j$ in Eq. (13) are the same as in Eq. (11). Assume the goal is to estimate the ground state energy of $\tilde{H}$. Experimenters consider a variational approach where the quantum computer 900 is used to measure the energy $\langle\psi|\tilde{H}|\psi\rangle$ of some fixed Q-qubit state $\psi$ that can be prepared on the available quantum hardware (i.e., quantum computer). (As an example variational approach, reference can be made to "Towards practical quantum variational algorithms" by D. Wecker, M. B. Hastings, and M. Troyer, in arXiv preprint arXiv:1507.08969, 2015, which is incorporated by reference.) The energy $\langle\psi|\tilde{H}|\psi\rangle$ is then minimized over some class of variational states $\psi$ using a suitable classical optimization algorithm. By linearity, it suffices to measure the energy $\langle\psi|D_j P_j|\psi\rangle$ separately for each j (i.e., for every term in the Hamiltonian). Consider some fixed term $D_j P_j$ and relabel the qubits such that $P_j$ acts on the first w qubits, where $w \le 6v_j$. Then $P_j = X_1 X_2 \ldots X_w$. As further details of the block 340 performed on the quantum computer 900 as discussed above, the experimenters introduce one ancillary qubit A initialized in the $|+\rangle$ state. Using the quantum computer 900, the experimenters apply the CNOT gate with the control qubit A and the target qubit j for each j=1, ..., w. The CNOT gate is a two qubit unitary operation, called controlled not gate, that applies a not on the target qubit if the source qubit is one. Next, experimenters measure qubit A in the X-basis. Let $\sigma=\pm 1$ be the measurement outcome. Note that $\sigma$ coincides with the eigenvalue off $P_j$ since the CNOTs propagate a single-qubit X on the qubit A to a product of X's on qubits 1, . . . , w. Second, one measures all qubits 1, . . . , Q in the Z-basis. The outcome of this measurement is a bit string $x \in \{0,1\}^Q$. Since $D_j$ and $P_j$ commute, one gets $$\langle \psi | D_j P_j | \psi \rangle \mathbb{E} = ) [\sigma \cdot \langle x | D_j | x \rangle], \qquad \text{Eq. (14)}$$

where the expectation value is taken over the measurements statistics of x and σ. Overall, the compressed measurement scheme in FIG. 3B requires Q+1 qubits. The Q qubits are needed for preparing the variational states ψ, by a quantum computation, and the extra qubit is used to apply a constant number of CNOT gates to obtain the measurement outcome on the quantum computer 900.

The new Hamiltonian is defined as $\tilde{H} = UHU^\dagger$, where U is an isometry (a unitary embedding) that maps the N-particle sector of the M-mode Fock space to the Hilbert space of Q qubits. Experimenters set $$U|x_1, \ldots, x_M\rangle = |s_1, \ldots, s_Q\rangle, \quad s_i = \sum_{j=1}^M A_{i,j} x_j \pmod{2}, \qquad \text{Eq. (15)}$$

where A is a binary matrix of size Q×M to be chosen later. Here $s_i=0, 1$ and $|s_1, \ldots, s_Q\rangle$ is a basis state of Q qubits. Let W(M,N) be the set of all M-bit strings with the Hamming weight N:

$$W(M,N) = \{x \in \{0,1\}^M : |x| = N\}.$$

Below, the experimenters use shorthand notations $U|x\rangle = |s\rangle$ and $s=Ax$, where $x \in W(M,N)$. In order for U to be an isometry, the matrix A must map different vectors $x \in W(M,N)$ to different Q-bit vectors s. In other words, one needs the following injectivity condition:

if $Ax = Ay$ for some $x, y \in W(M,N)$ then $x=y$. Eq. (16)

One can easily check that Eq. (16) is equivalent to $$\ker(A) \cap W(M, 2K) = \emptyset \text{ for all } 1 \leq K \leq N. \qquad \text{Eq. (17)}$$

Here ker (A) is the kernel of A, i.e., the set of M-bit vectors x such that Ax=0. Let us say that a matrix A is N-injective if it satisfies Eq. (16) or Eq. (17). The N-injectivity condition is satisfied whenever A is a parity check matrix describing a binary linear code that encodes M-Q bits into M bits with the minimum distance 2N+1. Indeed, in this case all errors of weight up to N must have different syndromes and thus a syndrome s=Ax uniquely identifies a weight-N error x.

To compute $\tilde{H}$, one needs an explicit formula for $U^\dagger$. Define a set $\Omega = A \cdot W(M,N)$. In other words, $s \in \Omega$ iff s=Ax for some $x \in W(M,N)$. Let χ(s) be the indicator function of Ω, that is, χ(s)=1 if $s \in \Omega$ and χ(s)=0 otherwise. Let $f: \Omega \to W(M,N)$ be a "decoding" map such that $$f(Ax) = x \text{ for all } x \in W(M,N).$$

This decoding map is well-defined due to the injectivity condition in Eq. (16). The experimenters arrive at $$U|x\rangle = |Ax\rangle \text{ and } U^\dagger|s\rangle = \chi(s)|f(s)\rangle \qquad \text{Eq. (18)}$$

for all $x \in W(M,N)$ and for all $s \in \{0,1\}^Q$. (Here f(s) can be defined arbitrarily for $s \notin \Omega$.) Let c (A) be the maximum weight of columns of A, $$c(A) = \max_{1 \leq j \leq M} \sum_{i=1}^Q A_{i,j}. \qquad \text{Eq. (19)}$$

Consider first a hopping term $V_j = a_\alpha^\dagger a_\beta + a_\beta^\dagger a_\alpha$. Without loss of generality, $\alpha \leq \beta$. Define $$Z_{(\alpha,\beta)} = \prod_{\alpha < \gamma < \beta} Z_\gamma \text{ and } \Pi_{\alpha,\beta} = |10\rangle\langle 10|_{\alpha,\beta} + |01\rangle\langle 01|_{\alpha,\beta}. \qquad \text{Eq. (20)}$$

The operators $Z_{(\alpha,\beta)}$ and $\Pi_{\alpha,\beta}$ act on the Hilbert space of Q qubits. Let us agree that $Z_{(\alpha,\alpha)} = I$ and $\Pi_{\alpha,\alpha} = |1\rangle\langle 1|_\alpha$. Using Eq. (18) one can easily check that $$UV_j U^\dagger |s\rangle = d(s)|s \oplus A^\alpha \oplus A^\beta\rangle, \qquad \text{Eq. (21)}$$

where $A^1, \ldots, A^M$ are the columns of A considered as Q-bit strings, ⊕ denotes the bitwise XOR, and $$d(s) = \chi(s) \langle f(s) | Z_{(\alpha,\beta)} \Pi_{\alpha,\beta} | f(s) \rangle \in \{0, \pm 1\}. \qquad \text{Eq. (22)}$$

Experimenters conclude that $UV_j U^\dagger = P_j D_j$, where $D_j$ is a diagonal operator such that $\langle s|D_j|s\rangle = d(s)$ and $P_j$ applies Pauli X to each qubit in the support of $A^\alpha \oplus A^\beta$. The operator $P_j$ has weight at most 2c(A), see Eq. (19). Note that $D_j P_j = P_j D_j$ since $d(s \oplus A^\alpha \oplus A^\beta) = d(s)$. The case when $V_j$ is a controlled hopping term, $V_j = a_\gamma^\dagger a_\gamma (a_\alpha^\dagger a_\beta + a_\beta^\dagger a_\alpha)$, is analogous to the above if one replaces $\Pi_{\alpha,\beta}$ by $|1\rangle\langle 1|_\gamma \Pi_{\alpha,\beta}$. Finally consider a double hopping term, $V_j = a_\alpha^\dagger a_\beta^\dagger a_\gamma a_\delta + a_\delta^\dagger a_\gamma^\dagger a_\beta a_\alpha$, where $\alpha < \beta < \gamma < \delta$. Using Eq. (18) one can easily check that $$UV_j U^\dagger |s\rangle = d(s)|s \oplus A^\alpha \oplus A^\beta \oplus A^\gamma \oplus A^\delta\rangle, \qquad \text{Eq. (23)}$$

where $$d(s) = \chi(s) \langle f(s) | Z_{(\alpha,\beta)} Z_{(\gamma,\delta)} \Pi_{\alpha\beta,\gamma\delta} | f(s) \rangle \qquad \text{Eq. (24)}$$

and $$\Pi_{\alpha\beta,\gamma\delta} = |11\rangle\langle 11|_{\alpha,\beta} |00\rangle\langle 00|_{\gamma,\delta} + |00\rangle\langle 00|_{\alpha,\beta} |11\rangle\langle 11|_{\gamma,\delta}.$$

Note that d(s) takes values 0, ±1. Experimenters conclude that $UV_j U^\dagger = P_j D_j$, where $D_j$ is a diagonal operator such that $\langle s|D_j|s\rangle = d(s)$ and $P_j$ applies Pauli X to each qubit in the support of $A^\alpha \oplus A^\beta \oplus A^\gamma \oplus A^\delta$. The operator $P_j$ has weight at most 4c(A). Thus the new Hamiltonian $\tilde{H}$ is of the form as stated above (Recall (1) $D_j$ is a diagonal operator with matrix elements 0, ±1; (2) $P_j$ is an X-type Pauli operator of weight at most $6v_j$; (3) $P_j D_j = D_j P_j$.)

The operators $P_j$ are X-type Pauli operator of weight $$|P_j| \leq 2v_j c(A). \qquad \text{Eq. (25)}$$

Since U is an isometry, non-zero eigenvalues of the Hamiltonians H and $\tilde{H}$ are the same. Accordingly, the experimenters can always assume that the ground state energy of H is negative (otherwise replace H by H−λH where λ is a large positive constant). Thus H and $\tilde{H}$ have the same ground state energy.

To minimize the number of CNOTs required for the energy measurement the experimenters are to minimize the weight of the operators $P_j$, i.e., the number of two qubit unitary operations, called controlled not gates, Equivalently, experimenters are to keep the column weight c(A) small, see Eq. (25). Thus the remaining task is to construct N-injective matrices A with a small constant column weight c(A) and the smallest possible number of rows Q. From Eq. (17) one infers that all columns of A must be distinct, which is possible only if c(A)≥2. Suppose first that c(A)=2, that is, each column of A has at most two non-zero elements. Such matrix can be viewed as an incidence matrix of a graph $G_A$ with Q vertices and M edges such that $A_{i,j}=1$ iff the j-th edge is incident to the i-th vertex. (Columns of A that have weight-1 represent "dangling" edges that have only one end-point.) Using Eq. (17) one can check that A is N-injective if and only if the graph $G_A$ has no cycles of length 2, 4, ..., 2N (recall that a subset of edges C is called a cycle if any vertex has even number of incident edges from C). This condition however is too stringent. Indeed, the average vertex degree of the graph $G_A$ is d≥2M/Q. To achieve a constant qubits-to-modes ratio Q/M<1, experimenters utilize a family of graphs with the average vertex degree d>2. Using the Moore's bound [6] one can easily show that the number of vertices in such graph $G_A$ must be exponential in N. In other words, a constant qubits-to-modes ratio Q/M<1 can only be achieved if N=O(log (M)), which has limited practical interest.

Below experimenters focus on the next simplest case, namely c(A)=3. This yields $|P_j|\le 6v_j$ due to Eq. (25). Infinite families of N-injective matrices A with constant ratios Q/M<1, N/M>0, and c(A)=3 can be constructed from Low Density Parity Check (LDPC) codes with a constant encoding rate and a linear distance. (As an example of LDPC codes, reference can be made to "Low-density parity-check codes" by R. Gallager, in Information Theory, IRE Transactions on, 8(1):21-28, 1962, which is incorporated by reference) Although a low density parity check code is utilized in this example, it should be appreciated that other compression codes can be utilized as understood by one skilled in the art. Specifically, experimenters assert that for any constant 0<v<¼, for all (predefined) large enough M, and all N<vM there exists an N-injective matrix A with c(A)=3 and size Q×M, where Q satisfies Eq. (12). Indeed, consider some fixed pair Q,M and let A be a random binary matrix of size Q×M such that each column of A is drawn from the uniform distribution on W(Q,3). All columns of A are independent. By the union bound, the probability that A fails to be N-injective can be upper bounded as $$P_{fail} \le \sum_{K=1}^{N}\binom{M}{2K}P(Q,2K), \qquad \text{Eq. (26)}$$

where P(Q,2K) is the probability that a sum of 2K independent vectors drawn from the uniform distribution on W(Q,3) equals zero modulo two. Indeed, Eq. (17) implies that A is N-injective unless Ax=0 for some x∈W(M,2K) with 1≤K≤N. Thus the sum of columns of A in the support of x equals zero. The union bound then implies Eq. (26). Using Lemma 3.1 of "Rank deficiency in sparse random GF(2) matrices" by R. Darling, M. Penrose, A. Wade, and S. Zabell, in Electron. J. Probab, 19(83):1-36, 2014, which is incorporated by reference, one gets $$P(Q,2K) = 2^{-Q}\sum_{j=0}^{Q}\binom{Q}{j}(2p_j-1)^{2K}, \qquad \text{Eq. (27)}$$

with $$p_j = \binom{Q}{j}^{-1}\left[\binom{Q-3}{j}+3\binom{Q-3}{j-2}\right].$$

Here it is understood that $$\binom{n}{k}=0$$

unless 0≤k≤n. Using the Stirling's formula one can get a bound $$P(Q,2K) \le \left(\frac{6K}{eQ}\right)^{3K} \le \left(\frac{6N}{eQ}\right)^{3K} \equiv \eta^{3K}. \qquad \text{Eq. (28)}$$

Here e≡exp (1). Substituting Eq. (28) into Eq. (27) yields $$P_{fail} \le \sum_{K=1}^{N}\binom{M}{2K}\eta^{3K} \approx \sum_{K=1}^{vM}\exp[Mh(2K/M)+3K\log(\eta)], \qquad \text{Eq. (29)}$$

where h(x) is the Shannon entropy function. It follows that $P_{fail}<1$ whenever h(2v)+3v log (η)<0, which is equivalent to Eq. (12). Since $P_{fail}<1$, there must exist at least one N-injective matrix A with c(A)=3 and Q rows, where Q satisfies Eq. (12).

It is pointed out that choosing the constant c(A) large enough one can get arbitrarily close to the Gilbert-Varshamov bound, namely, Q≤M($h_2$(2N/M)+ε), where $$h_2(x) = -x\log_2(x) - (1-x)\log_2(1-x)$$

is the binary Shannon entropy function and ε>0 can be made arbitrarily small by choosing large enough c(A). This assertion follows from the existence of (predefined) good LDPC codes, see for instance Theorem A.3 of "Low-density parity-check codes".

The values of Q(M,N) shown in the table in FIG. 4 were obtained by numerically searching for N-injective matrices A with c(A)=3 and the smallest possible Q. Specifically, experimenters maximized an objective function F (A) defined as the number of distinct elements in the set A·W (M,N). Note that A is N-injective iff all elements of the set A·W(M,N) are distinct, that is, $$F(A) = \binom{M}{N}.$$

The function F (A) was maximized over the set of all binary matrices satisfying c(A)=3 using a version of simulated annealing algorithm.

Finally, experimenters show how to compute the decoding map f(s). Suppose A is a fixed N-injective matrix of size Q×M. Given a string s∈{0,1}$^Q$, one has to find x∈W(M,N) such that s=Ax or decide that no such string x exist, that is, s∉A·W(M,N). One is to decompose N=$N_1$+$N_2$, where $N_{1,2}$=N/2 for even N and $N_{1,2}$=(N±1)/2 for odd N. For each i=1, 2 let $T_i$ be a lookup table that stores syndromes t=Au for each u∈W(M,$N_i$). The entries of $T_i$ are sorted in the lexicographic order. Let $U_i$ be a lookup table that maps each entry t∈$T_i$ to a string u∈W(M, $N_i$) such that t=Au. Note that u as above is unique since A is $N_i$-injective due to Eq. (17). The tables $T_i$, $U_i$ can be computed by the computer 800 before the quantum simulation (on quantum computer 900), since they depend only on A. Suppose first that s=Ax for some x∈W(M,N). Consider any decomposition x=$u_1 \oplus u_2$ with $u_i \in$ W(M,$N_i$) and let $t_i$=$Au_i$. Then, the tables $T_1$ and $T_2$ must contain entries $t_1$ and $t_1 \oplus$s respectively. For each $t_1 \in T_1$ one is to check whether $T_2$ contains $t_2=t_1 \oplus$s. This can be done in time O(|$T_1$| log|$T_2$|) using the binary search since the table $T_2$ is sorted. Suppose one has found $t_1$, $t_2$ as above, the use the tables $U_i$ to find $u_i$ such that $t_i=Au_i$. Then A($u_1 \oplus u_2$)=s and |$u_1 \oplus u_2$|=N−2|$u_1 \cap u_2$|≤N. It follows that A(x$\oplus u_1 \oplus u_2$)=0 and x$\oplus u_1 \oplus u_2$ has even weight between 2 and 2N. From Eq. (17) one infers that x=$u_1 \oplus u_2$ and is done. In the remaining case, if a pair $t_1$,$t_2$ as above is not found, one can infer that Ax=s has no solutions with x∈W(M,N). The above algorithm is practical for medium size systems, say, e.g., M≤50 as one example but not limited to this example. Indeed, since M≤N/2, the tables $T_i$, $U_i$ have size at most $$\binom{M}{M/4} \approx 4 \times 10^{11}$$

for M=50. In general, computing the decoding map f(s) can appear to be a difficult computational problem so two examples are provided below for explanation purposes and not limitation.

Reduction 3: Example 1

Experimenters consider the simplest example of this reduction. Experimenters consider a single electron N=1 with eight orbitals M=8 as indicated in the left upper corner of Table 1 in FIG. 4. Following the Reduction 3 of this section, these 8 states (i.e., M=8) on $C^{2^8}$ can be compressed to 8 states on 3 qubits, i.e., $C^{2^3}$, as indicated in Table 1 of FIG. 4. This follows from applying the compression matrix A in Eq. (30) below to compress the 8 states to 3 qubits This case has the advantage of being particularly easy to work through, although it can appear a bit misleading since experimenters only construct a binary encoding of the single particle states in the 8 modes as the compression. In general, as explained above this is not the case and the result heavily relies on LDPC codes to ensure a low weight and efficiency. Now the experimenters continued proceeding through this compression in detail.

So experimenters consider the compression of the bit strings in W(8,1) on to Q(8,1)-qubits. This is done by applying to every x∈W(8,1) a parity check matrix A∈$M_{3 \times 8}(F_2)$ to obtain the set Ω. The relevant basis states for, this example, are just the 8 single particle states encoded in second quantization by the bit strings in W(8,1) are $$\left\{ \begin{array}{l} (10000000), (01000000), (00100000), (00010000), \\ (00001000), (00000100), (00000010), (00000001) \end{array} \right\}.$$

The simplest matrix A for this code is simply given by the binary encoding of the position of the particle counting from 0, . . . , 7 in the 8-bit strings above, so that one writes $$A = \begin{pmatrix} 0 & 1 & 0 & 1 & 0 & 1 & 0 & 1 \\ 0 & 0 & 1 & 1 & 0 & 0 & 1 & 1 \\ 0 & 0 & 0 & 0 & 1 & 1 & 1 & 1 \end{pmatrix} \quad \text{Eq. (30)}$$

From this, the experimenters can immediately read off the set Ω, which is given by the binary column vectors of A. The binary column vectors are the columns of A with entries 0, 1 that satisfy binary algebra. For every s∈Ω the decoding map f is defined by computing the decimal representation of the binary number s and choosing the 8-bit string with one in the correct spot. Hence the Isometry U acts for example on x=(00000100) as |101⟩=U|00000100⟩, while all other bit strings that are not in W(8,1) get mapped to zero such as U|10100000⟩=0. The conjugate $U^\dagger$ is constructed similarly.

Figure 6:
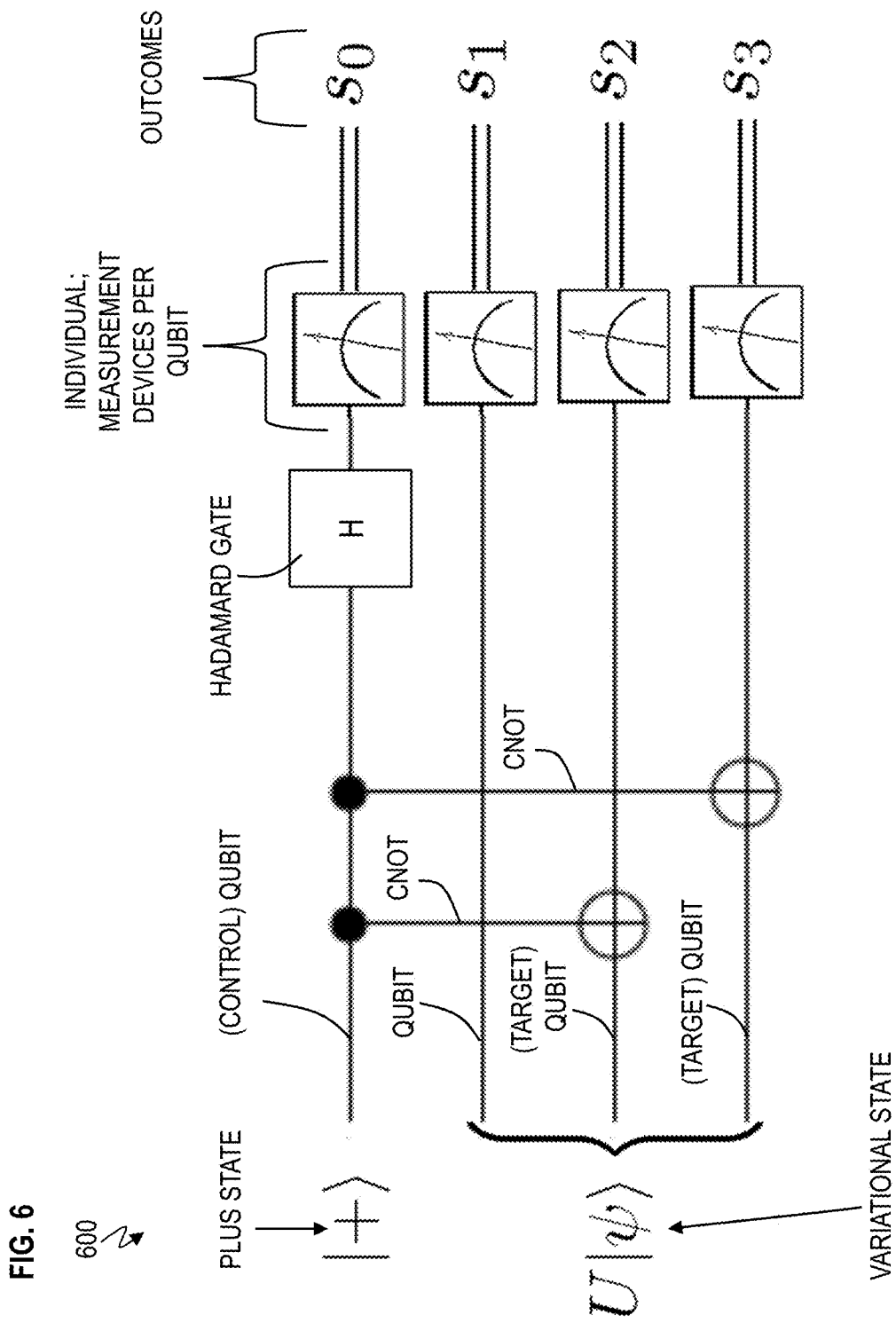
FIG. 6 is a measurement circuit for a quadratic hopping term for a single qubit according to one or more embodiments.

With this mapping in place, experimenters can now discuss the terms occurring in the Hamiltonian H=$\Sigma_j h_j D_j P_j$ and a measurement circuit 600 in FIG. 6. To illustrate the way this coding works, experimenters consider a simple quadratic hopping element $V_j = a_3^\dagger a_5 + a_5^\dagger a_3$, i.e., experimenters consider the hopping of a particle from the 5'th mode into mode number 3 and the conjugate. Recall that the action of $UV_j U^\dagger$ on the states labeled by s∈Ω is $UV_j U^\dagger$|s⟩=d(s) |s$\oplus A^3 \oplus A^5$⟩ for different values of s.

For simplicity, the circuit 600 is considered as a quantum computer with qubits (e.g., 4 qubits in this example) and 4 measurement devices (e.g., photon measurement devices) that individually measure the outputs of each qubit. For explanation purposes, the circuit 600 is illustrated as a simple quantum computer for ease of understanding although it should be appreciated that the quantum computer 900 can equally be utilized. The circuit 600 measures the expectation value ⟨ψ|$V_j$|ψ⟩=E[σ·⟨s|$D_j$|s⟩)], as explained above. Experimenters need Q(M,N)+1 qubits so here there are 4 qubits shown in the circuit 600, but it should be appreciated that more than 4 qubits can be utilized in the circuit 600. First, experimenters are to determine the support of the Pauli X operators in $P_j$, which is given by the bit values of $$A^3 = \begin{pmatrix} 1 \\ 1 \\ 0 \end{pmatrix} \text{ and } A^5 = \begin{pmatrix} 1 \\ 0 \\ 1 \end{pmatrix} \text{ so that } A^3 \oplus A^5 = \begin{pmatrix} 0 \\ 1 \\ 1 \end{pmatrix}. \quad \text{Eq. (31)}$$

Hence, by the convention introduced above, the Pauli-X contribution is given by $P_j = X_2 X_3$. Accordingly, FIG. 6 is given as an example circuit 600 that measures $D_j P_j$ and lets experimenters sample E[σ·⟨s|$D_j$|s⟩)]. FIG. 6 is measurement circuit 600 for the quadratic hopping term $V_j = a_3^\dagger a_5 + a_5^\dagger a_3 + a_3^\dagger a_5$ for a single qubit in eight modes with bit representation given by W(8,1) and compressed to Q(8,1)=3 qubits. Every line in the circuit 600 corresponds to a single qubit. The 3 bottom qubits are in the variational state psi ψ, while the top qubit is initialized in the plus (+) state. Then two controlled not operations (CNOT) are applied as indicated by the horizontal lines beginning with a black dot on the control qubit (the top qubit) and terminating on the two bottom qubits as target qubits. Then a Hadamard gate is applied to the top qubit before all qubits are measured in the computational basis. The Hadamard gate is a single qubit gate H performing the unitary transformation known as the Hadamard transform The measurement outcome of circuit 600 in FIG. 6 is given by four bits ($s_0^*$, $s_1^*$, $s_2^*$, $s_3^*$), where the ancilla bit $s_0$ is used to compute σ=$(-1)^{s_0}$ and the remaining three bits ($s_1$, $s_2$, $s_3$)=s determine d(s)=⟨s|$D_j$|s⟩ through the formula d(s)=χ(s)⟨f(s)|$Z_{(\alpha,\beta)} \Pi_{\alpha,\beta}$|f(s)⟩, where f(s) is the decoding map. In this case the decoding map is rather simple as explained above.

Experimenters now discuss some possible measurement outcomes of the circuit 600. It can be assumed that the first measurement outcome obtained from the circuit 600 is $(s_0^*, s_1^*, s_2^*, s_3^*) = (0,1,1,0)$. Experimenters then compute (on computer 800) that $\sigma = 1$ and that $d(1,1,0) = \langle 00010001|Z_{3,5}\Pi_{3,5}|0001000\rangle = 1$, so experimenters can add $\sigma \cdot \langle s|D_j|s\rangle = 1$ to the average. For the second measurement, it is assumed that the experimenters obtain the string $(s_0^*, s_1^*, s_2^*, s_3^*) = (1,1,0,0)$ from the circuit 600, for which the experimenters can compute (on the computer 800) in the same fashion that $\sigma = -1$ but $d(1,0,0) = 0$ since the decoded state $|f(1,0,0)\rangle = |01000000\rangle$ is annihilated by $\Pi_{3,5}$, so that this measurement outcome does not contribute to the expectation value. In general, experimenters proceed to sample from the compressed state $U|\psi\rangle$ that is prepared by the circuit 600 (or quantum computer 900) until the expectation value $E[\sigma \cdot \langle s|D_j|s\rangle]$ has been estimated to sufficient statistical accuracy (which can be predefined in advance).

Reduction 3: Example 2

Figure 7:
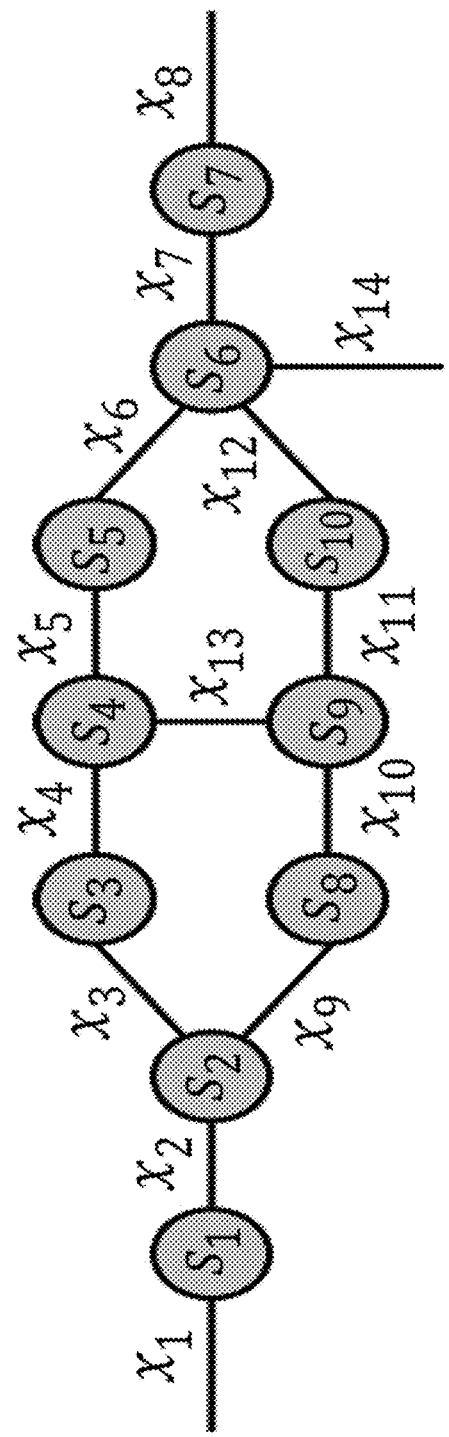
FIG. 7 is a graph illustrating a reduction from M=14 fermi modes with N=3 particles to Q=10 qubits according to one or more embodiments.

To consider a slightly more involved example, experimenters explicitly describe a reduction from a system of M=14 fermi modes to a system of Q=10 qubits. Experimenters assume that the number of particles is N=3. Consider a graph with 10 vertices and 14 edges shown in a graph in FIG. 7. FIG. 7 is a graph 700 describing a reduction from M=14 fermi modes with N=3 particles to Q=10 qubits. (In the state-of-the-art, 14 qubits would be needed in a quantum computer such as the circuit 600 or the quantum computer 900 because there are 14 fermi modes.) However, embodiments are designed to utilize fewer qubits (e.g., 10 qubits in this case) because of the Reduction 3. A Fock basis vector $|x_1, \ldots, x_{14}\rangle$ is mapped to a qubit state $|s_1, \ldots, s_{10}\rangle$, where $s_i$ equals the sum (modulo two) of $x_j$ over all edges incident to $s_i$. The injectivity condition Eq. (17) is satisfied whenever the graph 700 has no cycles of length 2, 4, or 6.

In FIG. 7, each vertex represents a qubit $i \in \{1, \ldots, Q\}$ whereas each edge represents a fermi mode $j \in \{1, \ldots, M\}$. Experimenters associate syndromes $s_i$ and fermionic occupation numbers $x_j$ with vertices and edges of the graph respectively. Next is to choose the parity check matrix A in Eq. (15) as the incidence matrix of the graph 700. In other words, a syndrome $s_i$ equals the sum (modulo two) of the variables $x_j$ located on edges incident to the vertex i. For example, $s_1 = x_1 + x_2 \pmod{2}$, $s_2 = x_2 x_3 x_9 \pmod{2}$, etc. Experimenters need to check that A satisfies injectivity condition Eq. (16). As was mentioned above, it suffices to check that the kernel of A contains no vectors of weight 2, 4, or 6, see Eq. (17). A direct inspection shows that the graph 700 shown on FIG. 7 contains no cycles of length 2, 4, or 6 (recall that a subset of edges x is called a cycle if any vertex has even number of incident edges from x). Since A is chosen as the incidence matrix of the graph 700, the equation $Ax=0$ is equivalent to x being a cycle. Therefore $Ax=0$ implies $|x| \neq 2, 4, 6$ and the injectivity condition Eq. (17) is satisfied. It should be appreciated that this example is very large and therefore the reduction matrix is provided in the simplest terms, i.e., in terms of the graph 700, for ease of understanding. This provides an example for the compression in Table 1 in FIG. 4 for N=3 and M=14 such that Q=10. The circuit measuring needs to be generated from the classical computer 800 in FIG. 8 and then run on the quantum computer 900 in FIG. 9.

The headings and/or subheadings are discontinued. FIG. 10 is a flow chart of a method 1000 of reducing (Reduction 1) a number of qubits required on (and/or a number of qubit required for simulation on) a quantum computer 900 according to one or more embodiments.

At block 1005, the computer 800 is configured to characterize (or describe) a Fermionic system in terms of a Hamiltonian, the Fermionic system including Fermions and Fermionic modes with a total number of 2M Fermionic modes, where the Hamiltonian has a parity symmetry encoded by spin up and spin down parity operators.

At block 1010, the computer 800 is configured to sort the Fermionic modes on the Hamiltonian, such that the first half of the 2M modes corresponds to spin up and the second half of the 2M modes corresponds to spin down.

At block 1015, the computer 800 is configured to transform the Hamiltonian and the parity operators utilizing a Fermion to qubit mapping, wherein the Fermion to qubit mapping transforms parity operators to a first single qubit Pauli operator on qubit M and a second single qubit Pauli operator on qubit 2M.

At block 1020, the computer 800 is configured to remove the qubit M having been operated on by the first single qubit Pauli operator and the qubit 2M having been operated on by the second single qubit Pauli operator.

Additionally, the Fermion to qubit mapping is a generalized Jordan-Wigner transformation.

The first single qubit Pauli operator on the qubit M is a Pauli Z-matrix on the qubit M. The second single qubit Pauli operator on the qubit 2M is a product of two Pauli Z-matrices at sites of the qubit M and the qubit 2M.

Removing the qubit M having been operated on by the first single qubit Pauli operator includes replacing the qubit M with an eigenvalues of +1 or −1 according to a parity the qubit M. Removing the qubit 2M having been operated on by the second single qubit Pauli operator includes replacing the qubit 2M with an eigenvalues of +1 or −1 according to a parity the qubit 2M. The qubit M encodes the parity of qubit M and the qubit 2M encode the parity of qubit 2M. The parities of the qubit M and the qubit 2M are known in advance.

The quantum computer 900 is configured to execute/simulate the Hamiltonian having reduced qubits.

Figure 11:
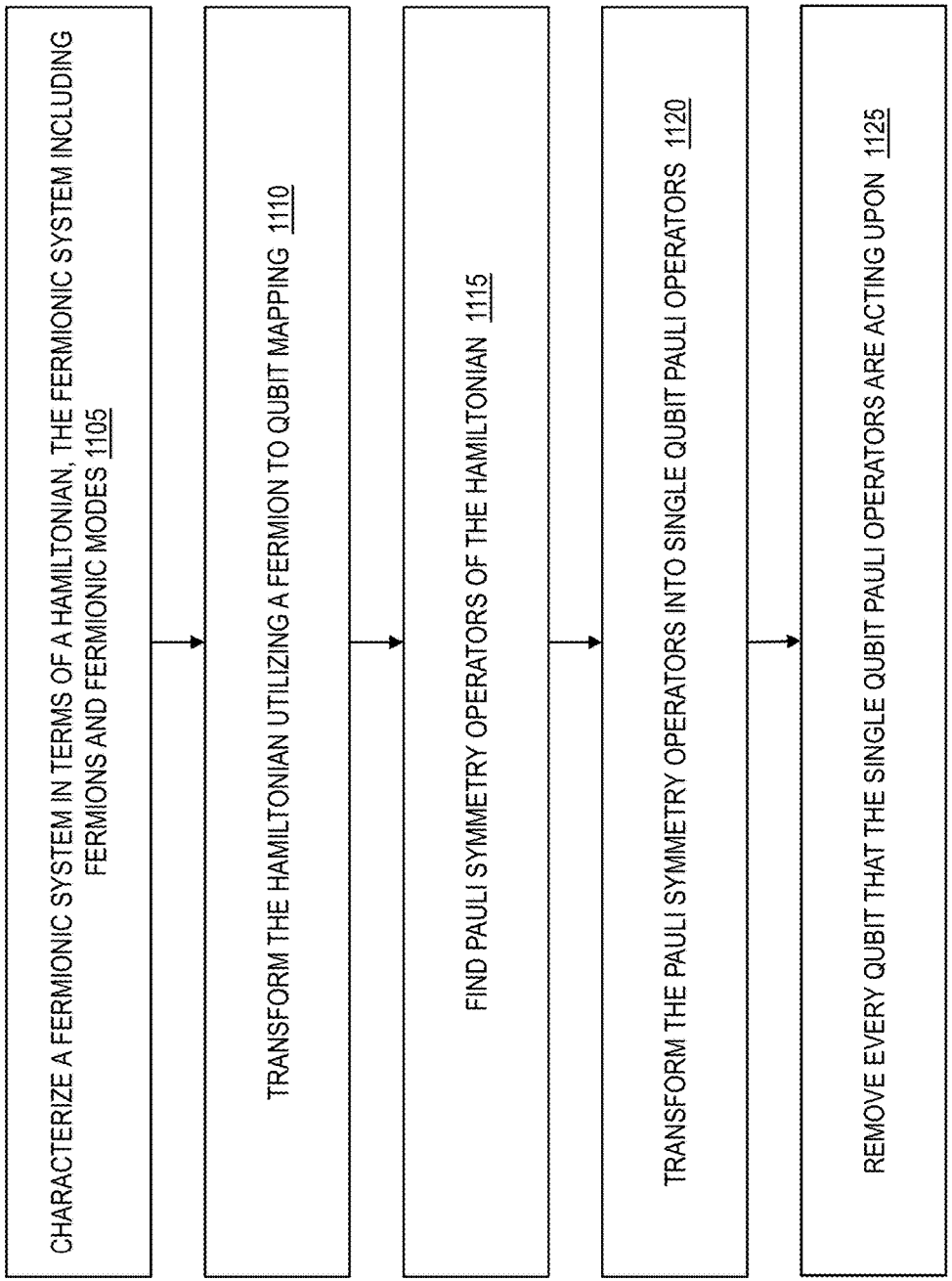
FIG. 11 is a flow chart of a method of reducing (Reduction 2) a number of qubits required on and/or a number of qubit required for simulation on a quantum computer according to one or more embodiments.

FIG. 11 is a flow chart 1100 of a method of reducing (Reduction 2) a number of qubits required on (and/or a number of qubit required for simulation on) a quantum computer 900 according to one or more embodiments.

At block 1105, the computer 800 is configured to characterize (or describe) a Fermionic system in terms of a Hamiltonian, the Fermionic system including Fermions and Fermionic modes.

At block 1110, the computer 800 is configured to transform the Hamiltonian utilizing a Fermion to qubit mapping. At block 1115, the computer 800 is configured to find Pauli symmetry operators of the Hamiltonian.

At block 1120, the computer 800 is configured to transform the Pauli symmetry operators into single qubit Pauli operators. At block 1125, the computer 800 is configured to removing every qubit that the single qubit Pauli operators are acting upon.

The Fermion to qubit mapping is a generalized Jordan-Wigner transformation or a standard Jordan-Wigner transformation.

Finding Pauli symmetry operators of the Hamiltonian includes: performing a parity check matrix on the Hamiltonian to determine the Pauli symmetry operators, if no Pauli symmetry operators are found, determining that no further reduction can be performed, and if the Pauli symmetry operators are found, determining a commuting set of the Pauli symmetry operators. Transforming the Pauli symmetry operators into the single qubit Pauli operators comprises constructing a Clifford transformation for the commuting set of the Pauli symmetry operators to map to the commuting set of the Pauli symmetry operators to the single qubit Pauli operators.

FIG. 12 is a flow chart 1200 of a method of reducing (Reduction 3) a number of qubits required on (and/or a number of qubit required for simulation on) a quantum computer 900 according to one or more embodiments.

At block 1205, the computer 800 is configured to characterize (or describe) a Fermionic system in terms of a Hamiltonian, the Fermionic system including Fermions and Fermionic modes with a total number of M Fermionic modes, where the Hamiltonian has particle number symmetry and N particles.

At block 1210, the computer 800 is configured to transform the Hamiltonian utilizing a Fermion to qubit mapping that transforms from M Fermionic modes to M qubits, where the M qubits are represented by M-bit strings in a computational basis.

At block 1215, the computer 800 is configured to applying a compression map to the Hamiltonian such that the Hamiltonian having the M qubits is mapped to a transformed Hamiltonian with Q qubits where Q<M, where the compression map maps the M-bit strings labeling the M qubits in the computational basis with Hamming weight N to Q-bit strings.

The computational basis is a 0 and 1 for each of the M qubits. The quantum computer 900 is configured to measure an energy of the transformed Hamiltonian with the Q qubits, the quantum computer including a quantum measurement circuit on Q+1 qubits. As a result measured energy measured by the quantum computer 900, the computer 800 is configured to receive measured energy for each compressed term of the transformed Hamiltonian, perform a decoding on the measured energy to obtain measured results of each uncompressed term in the Hamiltonian, and combine the measured results to obtain the energy of the Hamiltonian prior to applying the compression map.

The transformed Hamiltonian includes compressed terms, and the Hamiltonian prior to applying the compression map includes uncompressed terms.

Figure 9:
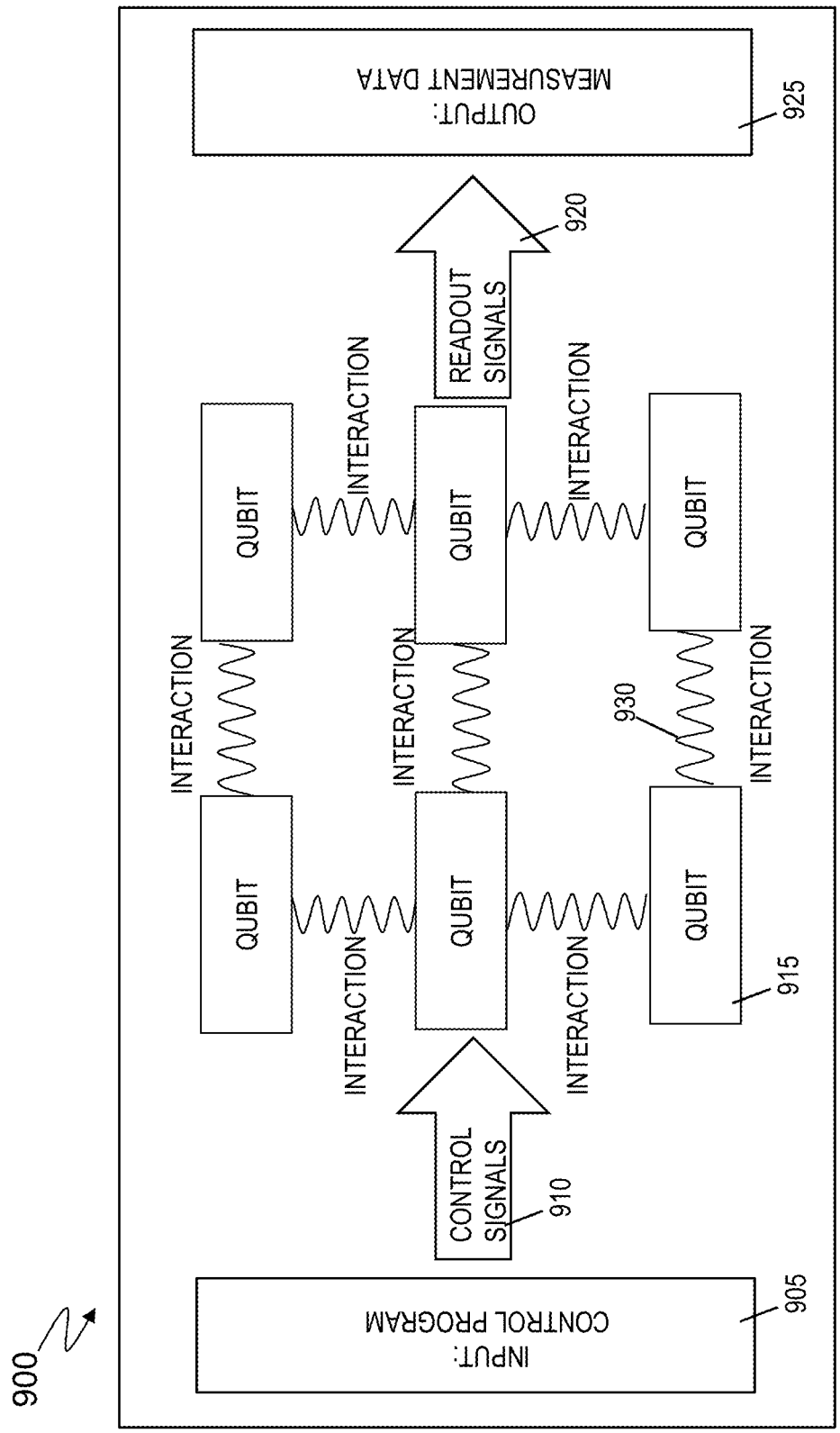
FIG. 9 is an example of a quantum computer configured to execute the output of Reductions 1, 2, and/or 3 according to one or more embodiments.

FIG. 9 is an example of a quantum computer 900 (quantum hardware) that can process the output of the Reductions 1, 2, and/or 3 according to embodiments. In general, a quantum computer is any physical system that obeys the laws of quantum mechanics which satisfy the DiVincenzo criteria. These criteria set the requirements on the quantum mechanical system to be considered a quantum computer. The criteria include (1) a scalable physical system with well-characterized qubits, (2) the ability to initialize the state of the qubits to a simple fiducial state, (3) long relevant decoherence times, (4) a "universal" set of quantum gates, (5) a qubit-specific measurement capability, (6) the ability to interconvert stationary and flying qubits, and (7) the ability to faithfully transmit flying qubits between specified locations.

The quantum computer 900 in FIG. 9 illustrates an input 905 as a control program, control signals 910, qubits 915, readout signals 920, and measurement data 925 as the output. As a quantum mechanical system that satisfies these requirements, the quantum computer 900 (as well as the quantum computer 600) is configured to receive control signals 910 as input 905 information (i.e., Reductions 1, 2, and/or 3) to apply a sequence of quantum gates and apply measurement operations. The quantum gates between different qubits 915 are mediated through their interactions 930. The measurement operators produce classical signals (as measurement data 925) that can be read by an experimenter controlling the system, i.e., the quantum computer 900.

Now turning to FIG. 8, an example illustrates a computer 800, e.g., any type of computer system configured to execute the Reductions 1, 2, and/or 3, discussed herein, such that the result of the Reductions 1, 2, and 3 can be input to the quantum computer 600, 900. The computer 800 can be a distributed computer system over more than one computer. Various methods, procedures, modules, flow diagrams, tools, applications, circuits, elements, and techniques discussed herein can also incorporate and/or utilize the capabilities of the computer 800. Indeed, capabilities of the computer 800 can be utilized to implement elements of exemplary embodiments discussed herein.

Generally, in terms of hardware architecture, the computer 800 can include one or more processors 810, computer readable storage memory 820, and one or more input and/or output (I/O) devices 870 that are communicatively coupled via a local interface (not shown). The local interface can be, for example but not limited to, one or more buses or other wired or wireless connections, as is known in the art. The local interface can have additional elements, such as controllers, buffers (caches), drivers, repeaters, and receivers, to enable communications. Further, the local interface can include address, control, and/or data connections to enable appropriate communications among the aforementioned components.

The processor 810 is a hardware device for executing software that can be stored in the memory 820. The processor 810 can be virtually any custom made or commercially available processor, a central processing unit (CPU), a data signal processor (DSP), or an auxiliary processor among several processors associated with the computer 800, and the processor 810 can be a semiconductor based microprocessor (in the form of a microchip) or a macroprocessor.

The computer readable memory 820 can include any one or combination of volatile memory elements (e.g., random access memory (RAM), such as dynamic random access memory (DRAM), static random access memory (SRAM), etc.) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 820 can incorporate electronic, magnetic, optical, and/or other types of storage media. Note that the memory 820 can have a distributed architecture, where various components are situated remote from one another, but can be accessed by the processor(s) 810.

The software in the computer readable memory 820 can include one or more separate programs, each of which includes an ordered listing of executable instructions for implementing logical functions. The software in the memory 820 includes a suitable operating system (O/S) 850, compiler 840, source code 830, and one or more applications 860 of the exemplary embodiments. As illustrated, the application 860 includes numerous functional components for implementing the elements, processes, methods, functions, and operations of the exemplary embodiments.

The operating system 850 can control the execution of other computer programs, and provides scheduling, input-output control, file and data management, memory management, and communication control and related services.

The application 860 can be a source program, executable program (object code), script, or any other entity comprising a set of instructions to be performed. When a source program, then the program is usually translated via a compiler (such as the compiler 840), assembler, interpreter, or the like, which can be included within the memory 820, so as to operate properly in connection with the O/S 850. Furthermore, the application 860 can be written as (a) an object oriented programming language, which has classes of data and methods, or (b) a procedure programming language, which has routines, subroutines, and/or functions.

The I/O devices 870 can include input devices (or peripherals) such as, for example but not limited to, a mouse, keyboard, scanner, microphone, camera, etc. Furthermore, the I/O devices 870 can also include output devices (or peripherals), for example but not limited to, a printer, display, etc. Finally, the I/O devices 870 can further include devices that communicate both inputs and outputs, for instance but not limited to, a NIC or modulator/demodulator (for accessing remote devices, other files, devices, systems, or a network), a radio frequency (RF) or other transceiver, a telephonic interface, a bridge, a router, etc. The I/O devices 870 also include components for communicating over various networks, such as the Internet or an intranet. The I/O devices 870 can be connected to and/or communicate with the processor 810 utilizing Bluetooth connections and cables (via, e.g., Universal Serial Bus (USB) ports, serial ports, parallel ports, FireWire, HDMI (High-Definition Multimedia Interface), etc.).

In exemplary embodiments, where the application 860 is implemented in hardware, the application 860 can be implemented with any one or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method of reducing a number of qubits required on a quantum computer, the method comprising:
   characterizing a system in terms of a Hamiltonian, the system including particles and particle modes, wherein the Hamiltonian has a parity symmetry encoded by a first characteristic and a second characteristic for parity operators;
   sorting the particle modes on the Hamiltonian, such that a first part of the particle modes corresponds to the first characteristic and a second part of the particle modes corresponds to the second characteristic;
   transforming the parity operators utilizing a particle to qubit mapping, wherein the particle to qubit mapping transforms the parity operators to a first qubit operator on a first qubit and a second qubit operator on a second qubit; and
   removing the first qubit having been operated on by the first qubit operator and the second qubit having been operated on by the second qubit operator.

2. The method of claim 1, wherein the particle to qubit mapping is a generalized Jordan-Wigner transformation.

3. The method of claim 1, wherein the first qubit operator on the first qubit is a matrix on the first qubit.

4. The method of claim 1, wherein the second qubit operator on the second qubit is a product of two matrices at sites of the first qubit and the second qubit.

5. The method of claim 1, wherein removing the first qubit having been operated on by the first qubit operator comprises replacing the first qubit with eigenvalues of +1 or −1 according to a parity of the first qubit.

6. The method of claim 5, wherein removing the second qubit having been operated on by the second qubit operator comprises replacing the second qubit with eigenvalues of +1 or −1 according to a parity of the second qubit.

7. The method of claim 6, wherein the parities of the first qubit and the second qubit are known in advance.

8. The method of claim 1, wherein the particle modes define a total number of 2M Fermionic modes, the first qubit defines qubit M, and the second qubit defines qubit 2M.

9. The method of claim 1, wherein the first characteristic defines a first spin direction and the second characteristic defines a second spin direction; and
   wherein the first qubit operator defines a first single qubit Pauli operator and the second qubit operator defines a second single qubit Pauli operator; and
   wherein the system comprises a Fermionic system.

10. A computer-implemented method of reducing a number of qubits required on a quantum computer, the method comprising:
    characterizing a system in terms of a Hamiltonian, the system including particles and particle modes;
    transforming the Hamiltonian utilizing a particle to qubit mapping;
    finding symmetry operators of the Hamiltonian;
    transforming the symmetry operators into single qubit operators; and
    removing every qubit that the single qubit operators are acting upon.

11. The method of claim 10, wherein the particle to qubit mapping comprises a generalized Jordan-Wigner transformation.

12. The method of claim 10, wherein the particle to qubit mapping comprises a standard Jordan-Wigner transformation.

13. The method of claim 10, wherein finding symmetry operators of the Hamiltonian comprises performing a parity check matrix on the Hamiltonian to determine the symmetry operators.

14. The method of claim 13, wherein finding symmetry operators of the Hamiltonian further comprises:
    if no symmetry operators are found, determining that no further reduction can be performed; and
    if the symmetry operators are found, determining a commuting set of the symmetry operators.

15. The method of claim 14, wherein transforming the symmetry operators into the single qubit operators comprises constructing a transformation for the commuting set of the symmetry operators to map to the commuting set of the symmetry operators to the single qubit operators.

16. The method of claim 15, wherein a Clifford transformation is the transformation constructed for the commuting set of the symmetry operators to map to the commuting set of the symmetry operators to the single qubit operators.

17. The method of claim 10, wherein the particle modes comprise Fermionic modes and the particles comprises Fermions.

18. The method of claim 10, wherein the symmetry operators comprise Pauli symmetry operators and the single qubit operators comprise single qubit Pauli operators.

19. A computer-implemented method of reducing a number of qubits required on a quantum computer, the method comprising:
- characterizing a system in terms of a Hamiltonian, the system including particles and modes with a total number of M modes, wherein the Hamiltonian has particle number symmetry and N particles;
- transforming the Hamiltonian utilizing a particle to qubit mapping that transforms from M modes to M qubits, wherein the M qubits are represented by M-bit strings in a computational basis; and
- applying a compression map to the Hamiltonian such that the Hamiltonian having the M qubits is mapped to a transformed Hamiltonian with Q qubits where Q<M, wherein the compression map maps the M-bit strings labeling the M qubits in the computational basis with Hamming weight N to Q-bit strings.

20. The method of claim 19, wherein the computational basis is a 0 and 1 for each of the M qubits.

* * * * *